United States Patent
Siligaris et al.

(10) Patent No.: US 9,722,619 B2
(45) Date of Patent: Aug. 1, 2017

(54) FREQUENCY SYNTHESIS DEVICE AND METHOD

(71) Applicant: COMMISSARIAT A L'ENERGIE ATOMIQUE ET AUX ENERGIES ALTERNATIVES, Paris (FR)

(72) Inventors: Alexandre Siligaris, Grenoble (FR); Jose-Luis Gonzalez Jimenez, Voreppe (FR)

(73) Assignee: Commissariat A L'Energie Atomique at aux Energies Alternatives, Paris (FR)

( * ) Notice: Subject to any disclaimer, the term of this patent is extended or adjusted under 35 U.S.C. 154(b) by 0 days.

(21) Appl. No.: 14/893,848

(22) PCT Filed: May 26, 2014

(86) PCT No.: PCT/EP2014/060793
§ 371 (c)(1),
(2) Date: Nov. 24, 2015

(87) PCT Pub. No.: WO2014/191339
PCT Pub. Date: Dec. 4, 2014

(65) Prior Publication Data
US 2016/0105190 A1 Apr. 14, 2016

(30) Foreign Application Priority Data
May 27, 2013 (FR) ..................... 13 54752

(51) Int. Cl.
*H03L 7/16* (2006.01)
*H03L 7/18* (2006.01)
(Continued)

(52) U.S. Cl.
CPC .................. *H03L 7/16* (2013.01); *H03L 7/18* (2013.01); *H03L 7/24* (2013.01); *H04B 1/7174* (2013.01)

(58) Field of Classification Search
CPC .... H03L 7/16; H03L 7/18; H03L 7/24; H04B 1/7174
(Continued)

(56) References Cited

U.S. PATENT DOCUMENTS

| 8,379,698 B2 | 2/2013 | Murray et al. |
| 2009/0066436 A1* | 3/2009 | Wang ..................... H04B 1/006 332/119 |
| 2010/0142598 A1 | 6/2010 | Murray et al. |

FOREIGN PATENT DOCUMENTS

WO    2008/069444 A1    6/2008

OTHER PUBLICATIONS

R. Xu et al.: "Power-Efficient Switching-Based CMOS UWB Transmitt for UWB Communications and Radar Systems", IEEE Transactions on microwave theory and techniques, IEEE Service Center, Piscataway, NJ, US, vol. 54, No. 9, Aug. 1, 2006, pp. 3271-3277, (XP001545203).

(Continued)

*Primary Examiner* — William Hernandez
(74) *Attorney, Agent, or Firm* — Oblon, McClelland, Maier & Neustadt, L.L.P.

(57) ABSTRACT

A frequency synthesis device, including: a first generator configured to generate a periodical signal with a frequency $f_1$; a second generator, coupled to the first generator and generating from the signal with a frequency $f_1$ a signal $S_G$ corresponding to a train of oscillations with a frequency substantially equal to $N \cdot f_1$, with a duration lower than $T_1=1/f_1$ and periodically repeated at the frequency $f_1$; a third generator generating, from the signal $S_G$, m periodical signals $S_{LO\_CH1}$ to $S_{LO\_CHm}$ with frequency spectra each include a main line with a frequency $f_{LO\_CHi}$ corresponding to an integer multiple of $f_1$, with $1 \leq i \leq m$, the third generator operating as a band-pass filter applied to the signal $S_G$ and discarding from the frequency spectra of each of the periodical signals $S_{LO\_CH1}$ to $S_{LO\_CHm}$ lines other than the main line with a frequency $f_{LO\_CHi}$.

14 Claims, 14 Drawing Sheets

(51) Int. Cl.
*H03L 7/24* (2006.01)
*H04B 1/717* (2011.01)

(58) Field of Classification Search
USPC .......................................................... 327/105
See application file for complete search history.

(56) References Cited

OTHER PUBLICATIONS

A. Siligaris et al. "A 60 GHz UWB Impulse Radio Transmitter with Integrated Antenna in CMOS65nm SOI Technology", Silicon Monolithic Integrated Circuits in RF Systems (SiRF), 2011 IEEE 11th Topical Meeting on, pp. 153-156, Jan. 17-19, 2011.
O. Richard et al., "A 17.5-to-20.94GHz and 35-to-41.88GHz PLL in 65nm CMOS for Wireless HD Applications", Solid-State Circuits Conference Digest of Technical Papers (ISSCC), 2010 IEEE International, pp. 252-253, Feb. 7-11, 2010.
M. Tiebout et al., "50 GHz Direct Injection-Locked Oscillator Topology as Low Power Frequency Divider in 0.13 μm CMOS", Solid-State Circuits Conference, 2003. ESSCIRC '03, Proceedings of the 29th European, pp. 73-76, Sep. 16-18, 2003.
V. Dyadyuk et al.: "A Mutlitgigabit Millimeter-Wave Communication System with Improved Spectral Efficiency", Microwave Theory and Techniques, IEEE Transactions on, vol. 55, n° 12, pp. 2813-2821, Dec. 2007.
French Search Report issued on Feb. 28, 2014 for FR 13 54752 filed on May 27, 2013.
International Search Report issued on Jul. 1, 2014 for PCT/EP2014/060793 filed on May 26, 2014.

\* cited by examiner

BACKGROUND ART

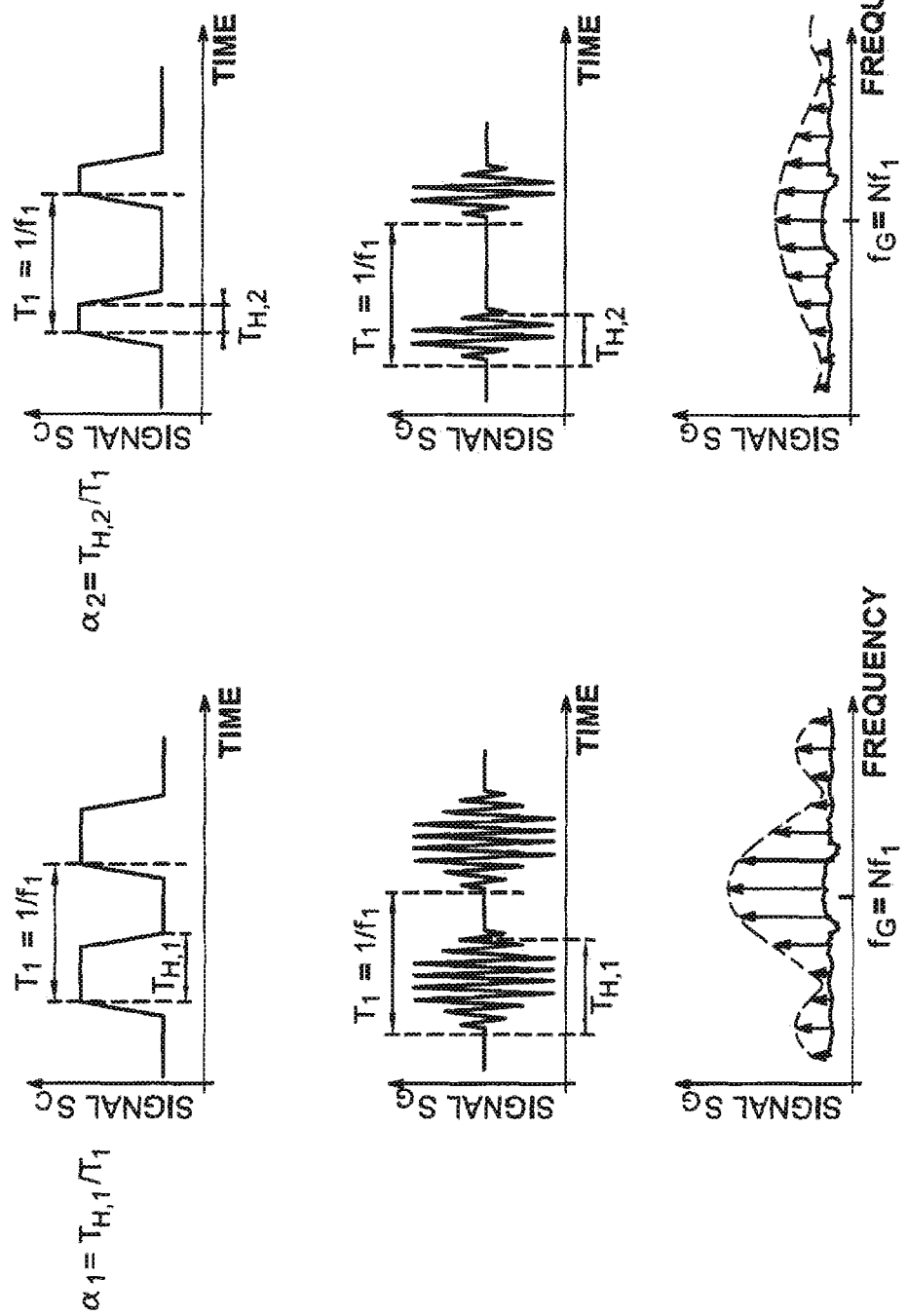

FREQUENCY SYNTHESIS DEVICE AND METHOD

TECHNICAL FIELD

The invention relates to the field of the transceiver devices, and in particular that of integrated wireless transceiver devices involving frequency stable signals for making one or more frequency translations in the transmitting and/or receiving part of these devices. The invention relates in particular to a frequency synthesis device and method enabling frequency stable signals to be provided from a stable signal with a lower frequency. The invention also relates to a device for transmitting and/or receiving signals, operating for example in the radiofrequency (RF) range, including such a frequency synthesis device for outputting stable periodical signals used upon transmitting-receiving signals.

STATE OF PRIOR ART

A frequency synthesis device enables a frequency stable signal for being used for example in an RF communication system to be provided. Thus, upon emitting signals, a signal containing the information to be sent can be modulated with the frequency stable signal acting as a carrier signal for conveying this information. The frequency synthesis performed defines in this case the value of the transmission carrier frequency. Upon receiving signals, the frequency synthesis enables this frequency stable signal to be provided to demodulate the information received. The frequency stable signal obtained can also be used to make a frequency translation between the baseband and intermediate frequencies, or between the intermediate frequencies and transmission and reception carrier frequencies.

A first example for making a frequency synthesis device 10, used for example in a carrier frequency transceiver system, is shown in FIG. 1.

The device 10 includes a voltage-controlled oscillator 12 (VCO), outputting a sinusoidal signal the oscillation frequency of which is controlled by a voltage applied at the input of the oscillator 12. The oscillator 12 is made such that it can output an oscillation signal in the frequency band used by the communication system including the device 10. It is considered that the oscillator 12 outputs a sinusoidal signal with a frequency $f_1$.

The output signal provided by the oscillator 12 alone is unstable in the RF's frequency bands and micro-wave, drifts over time and has a high spectral impurity (phase noise). Therefore, it is necessary to stabilize it in frequency by locking (namely by blocking or synchronizing) its phase to that of a very frequency stable signal provided for example by a very high quality resonator, such as a quartz resonator, which however operates at a lower frequency (generally in the MHz range).

In order to lock the phase of the signal outputted by the oscillator 12 and thus stabilize the oscillation frequency $f_1$ of this signal, the oscillator 12 is regulated within a phase-locked loop (PLL). This PLL includes several frequency dividers connected in series to each other (shown as a single element having the reference 14 in FIG. 1) and able to divide together the frequency $f_1$ of the signal outputted by the oscillator 12 by an integer or fractional number N. At the output of the frequency dividers 14, a periodical signal with a frequency $f_1/N$ is obtained, which is then compared with a very stable reference periodical signal, such as a signal with a frequency $f_{quartz}$ provided by a quartz resonator 16.

The frequency dividers 14 are made such that the factor N obtained enables the frequency $f_1/N$ to be close to the frequency $f_{quartz}$. The comparison between both these signals is made by a phase comparator 18 ("Phase Frequency Detector" PFD) outputting signals proportional to the phase difference measured between both these signals and the value of which is positive or negative depending on the sign of the difference $f_1/N - f_{quartz}$. This output signal is sent at the input of a charge pump circuit and of a filter 20 outputting a signal applied to the control input of the oscillator 12 enabling its oscillation frequency to be adjusted such that $f_1/N = f_{quartz}$ once the loop is stabilized.

With such a frequency synthesis device 10, the frequency stability of the signal with a frequency $f_1$ outputted by the oscillator 12, its time drift and its spectral purity essentially depend on characteristics of the reference signal with a frequency $f_{quartz}$ provided by the resonator 16 as well as the division rank N of the frequency dividers 14. Furthermore, the frequencies synthesizable by the device 10 also depend on the oscillation frequency range of the oscillator 12 which is such that:

$$f_{osc\,min} < N \cdot f_{quartz} < f_{osc\,max}$$

$f_{oscmin}$ and $f_{oscmax}$ being the minimum and the maximum oscillation frequencies of the oscillator 12 respectively.

The oscillator 12 is for example made as differential twisted pairs (resonator coupled with a negative resistance). The frequency dividers 14 use different architectures depending on whether they are positioned at the start of the string (close to the frequency ft that is on the oscillator 12 side) or at the end of the string, at a lower frequency (close to the frequency $f_{quartz}$ that is on the phase comparator 18 side). At high frequencies, the frequency dividers use CML ("Current Mode Logic") or ILFD ("Injection-locked Frequency Divider") type circuits. The frequency dividers operating at lower frequencies use counter-type purely digital architectures. The circuits forming the frequency dividers 14 can be programmable such that the value of the frequency synthetized by the device 10 is programmable ($f_1$ is in this case a multiple of $f_{quartz}$) via choosing the value of N (the value of $f_{quartz}$ is a function of the nature of the resonator 16 and thus is not programmable).

The major drawback of this type of frequency synthesis device 10 is to use a long string of frequency dividers 14 in view of the high value of N when the difference between $f_{quartz}$ and $f_1$ is great. The first frequency dividers (those on the oscillator 12 side) operating at high frequencies have a high static electricity consumption. Moreover, when the first frequency dividers employ an ILFD-type architecture, in this case they use resonating elements (inductors or transmission lines) occupying a high circuit area. On the other hand, the PLL uses a feedback which acts on the oscillation frequency of the oscillator 12. But, this feedback can lead the PLL to instabilities (non-locking of the frequency $f_1$) because this loop operates at a high frequency.

A second example of making a frequency synthesis device 30, used in a transceiver system with a high carrier frequency (RF range) is shown in FIG. 2.

In comparison with the previously described device 10, this second frequency synthesis device 30 uses a reverse approach consisting in multiplying the reference frequency $f_{quartz}$ until the required frequency $f_1$ is obtained. As shown in FIG. 2, such a device 30 includes a resonator 16, for example similar to that of the previously described device 10, outputting the reference stable signal with a frequency $f_{quartz}$. This signal is applied at the input of a string of frequency multiplier circuits 32 with a rank N (shown as a single element in FIG. 2) able to output the signal with a frequency $f_1 = N \cdot f_{quartz}$.

The device 30 includes neither an oscillator nor a phase locked loop. The first frequency multiplier circuits 32 (those lying on the resonator 16 side) operate at low frequencies and use standard digital architectures. On the other hand, the frequency multiplier circuits 32 located at the end of the string operate at high frequencies and use sub-harmonic locking architectures, or involve so-called "push-push" techniques, with distortion, harmonic amplification or other. The stability and purity of the signal (phase noise) with a frequency $f_1$ obtained at the output of the frequency synthesis device 30 essentially depend on the characteristics of the reference stable signal provided by the resonator 16 and on the multiplication rank N.

When the multiplication rank N is high (which is the case for a frequency synthesis device being part of an RF communication system), it is necessary to use a high number of frequency multiplier circuits to make the string 32, resulting in high consumption and occupied circuit area. Furthermore, there is no programmable frequency multiplier circuit, which makes the rank N fixed and does not enable the device 30 to synthesise frequencies programmably.

A third example of making a frequency synthesis device 40, used for example in a transceiver system with a high carrier frequency (RF), is shown in FIG. 3.

The architecture of this device 40 corresponds to a combination of architectures of the previously described frequency synthesis devices 10 and 30. A first frequency synthesis is performed at the frequency $f_1$ using an architecture similar to that of the device 10 (by involving elements analogous to the elements 12, 14, 16, 18, 20 of the device 10). The signal with a frequency $f_1$ is then multiplied by a string of frequency multiplier circuits 42 with a rank K in order to obtain at the output a signal with a frequency $f_2 = K \cdot f_1 = K \cdot N \cdot f_{quartz}$.

The advantage of such a device 40 is to be able to synthetize programmable frequencies (via programming the parameter N) and to increase the value of the frequency obtainable at the output. The synthesizable frequencies are such that:

$$f_{oscmin} < N \cdot k \cdot f_{quartz} < f_{oscmax}$$

Although the frequency synthesis device 40 solves part of the drawbacks of the frequency synthesis devices 10 and 30, the drawback of all these frequency synthesis devices is to involve full strings of frequency dividers and/or multipliers with high ranks (N and K can be in the order of a few hundreds or a few thousands), because of great differences between the values of the carrier frequencies for being obtained at the output of the devices and the relatively low frequencies that can be provided by stable resonators such as quartz resonators. But, these full strings of frequency divider or multiplier circuits have a high electric consumption and occupy also a high circuit area.

The generation of several frequency stable signals is also necessary in the case of transmitting/receiving signals in a wide RF frequency band, for example of several GHz, which requires to make a division of this wide band into several different frequency sub-bands in order to simultaneously process in parallel in baseband the transmitted and received signals by dividing them into several channels. In this case, it is possible to involve several devices similar to those previously described. Several frequency generators, or frequency synthesis devices, each comprising a local oscillator are generally used in this case to perform multiplexing and demultiplexing in the frequency domain of these frequency sub-bands.

Document "A Multigigabit Millimeter-Wave Communication System With Improved Spectral Efficiency" by V. Dyadyuk et al., Microwave Theory and Techniques, IEEE Transactions on, vol. 55, n°12, pages 2813-2821, December 2007, describes such a transceiver system wherein digital data are distributed in N channels to be capable of being processed. On the transmitter side, analog signals with intermediate frequencies from each digital channel and obtained with N digital-analog converters are multiplexed in the desired frequency domain, requiring to do so N local oscillators used with N mixers. The signal obtained with an intermediate frequency is then translated at the transmission frequency by a first amplified sub-harmonic converter and then transmitted by an antenna. On the receiver side, the signal received is translated to the intermediate frequencies by another amplified sub-harmonic converter and then demultiplexed in the frequency domain of the N frequency sub-bands of the N channels via using N local oscillators and N mixers, the signals obtained being then sampled by N analog-digital converters and finally decoded by an FPGA in digital channels and multiplexed into a single digital stream.

The main drawback of such a system is to involve numerous local oscillators on the transmission side and on the reception side to be capable of making frequency translations, which raises obvious problems of cost, complexity and area necessary for making them.

Document US 2010/0142598 A1 describes another transceiver system also involving several channels. Once again, multiple local oscillators are required to perform multiplexing and demultiplexing in the frequency domain of the signals in the different channels.

DISCLOSURE OF THE INVENTION

One purpose of the present invention is to provide a new type of frequency synthesis device not having the previously set forth drawbacks of the frequency synthesis devices of prior art, and enabling several frequency stable periodical signals to be generated without involving as many local oscillators as signals intended to be generated.

For this, it is provided a frequency synthesis device including at least:
first means able to generate a periodical signal with a frequency $f_1$,
second means able to generate at least one pulsed periodical signal a centre frequency $f_G$ of which is equal to $N \cdot f_1$, with N an integer number higher than 1,
this means coupled to the first and second means, able to receive at the input the periodical signal with a frequency $f_1$ and to control the generation of the pulsed periodical signal by the second means only over part of each period of the periodical signal with a frequency $f_1$,
fourth means able to generate, from the pulsed periodical signal outputted by the second means, periodical signals $S_{LO\_CH1}$ to $S_{LO\_CHm}$, for example sinusoidal ones, with a frequency $f_{LO\_CH1}$ to $f_{LO\_CHm}$ corresponding to integer multiples of $f_1$.

The present invention further provides a frequency synthesis device including at least:
first means, or a first generator, able to generate a periodical signal with a frequency $f_1$,
second and third means, or a second generator, coupled to the first means and able to receive at the input the periodical signal with a frequency $f_1$ and to generate at least one signal $S_G$ corresponding to a train, or group, of oscillations with a frequency substantially equal to $N \cdot f_1$, with a duration lower than $T_1 = 1/f_1$ and periodically repeated at the frequency $f_1$, with N an integer number higher than 1, fourth means, or a third generator, able to generate, from the signal $S_G$, N periodical signals $S_{LO\_CH1}$ to $S_{LO\_CHm}$, for example sinusoidal ones, the frequency spectra of which each include a main line, or main peak, with a frequency $f_{LO\_CHi}$ corresponding to an integer multiple of $f_1$, with $1 \leq i \leq m$, i and m being integer numbers, the fourth means playing a role of a band-pass filter applied to the signal $S_G$ and discarding from the frequency spectra of each of the periodical signals $S_{LO\_CH1}$ to $S_{LO\_CHm}$ lines other than the main line with a frequency $f_{LO\_CHi}$.

Such a device enables a frequency synthesis which is stabilized in frequency and noise to be made. This device is based on multiplying a frequency of a signal, or more particularly generating, from a low frequency, complex periodical signals centred at higher frequencies, and subsequently recovering these frequencies in order to obtain frequency stable signals. Indeed, the second and third means generate, for example via the control made by the third means on the second means, one or more pulsed periodical signals the centre frequency(ies) $f_G$ or $f_{G1}$ to $f_{Gm}$ of which are multiples of a first generated signal with a frequency $f_1$. The third means can act on the second means as one or more control switches operating at the frequency $f_1$. Thus, in the spectrum (spectra) of the signal(s) outputted by the second and third means, corresponding for example to one or more pulsed sinusoidal signals, or more generally one or more signals corresponding to trains of oscillations having frequencies substantially equal to $N \cdot f_1$ or $N_i \cdot f_1$, with durations $T_H$ lower than $T_1 = 1/f_1$ and periodically repeated at the frequency $f_1$, with N and $N_i$ integer numbers higher than 1, there are several lines centred about the centre frequency $f_G = N \cdot f_1$ or centre frequencies $f_{Gi} = N_i \cdot f_1$, and spaced out by $f_1$ or a multiple of $f_1$ from each other. The fourth means are then used to recover, in this (these) spectrum (spectra), the desired line(s) and output one or more stable periodical signals, for example sinusoidal ones or having a substantially sinusoidal shape, with centre frequencies multiples of $f_1$.

The device according to the invention thus enables a synthesis of several higher frequencies ($f_{LO\_CH1}$ to $f_{LO\_CHm}$) to be made from a low frequency signal (frequency $f_1$) and a high frequency pulse generator formed by the second and third means.

The device according to the invention thus enables the signals $S_{LO\_CH1}$ to $S_{LO\_CHm}$ to be generated from a common structure without involving a feedback and stabilization structure specific to each of these signals, and without involving numerous local oscillators. Moreover, the signals $S_{LO\_CH1}$ to $S_{LO\_CHm}$ thus synthetized are all phase-synchronized because they are generated from the same periodical signal with a frequency $f_1$.

The device according to the invention enables, between the frequency $f_1$ and the frequencies $f_{LO\_CH1}$ to $f_{LO\_CHm}$ outputted, a multiplication of the high order frequency to be made without having the drawbacks of frequency multipliers of prior art. The device according to the invention does not use a string of conventional frequency multipliers as in some of the frequency synthesis devices of prior art and thus has the advantage of reducing the consumption and size of the frequency synthesis device.

Furthermore, the synthetized frequency is programmable via programming the parameter N and choosing recovered multiples of $f_1$.

The advantages of the device according to the invention are thus, with respect to the frequency synthesis devices of prior art comprising long strings of frequency multiplier or divider circuits, to reduce the electrical consumption of the device, to improve the performance of the performed frequency synthesis in terms of phase noise and frequency operating range, and also to reduce the design complexity of the device.

The frequency synthesis device according to the invention does not involve a long string of frequency dividers (causing high consumption and occupied area), nor a PLL operating at a high frequency (causing high frequency instabilities).

The device according to the invention is particularly suitable for operating within a communication system transmitting and receiving signals in wide RF frequency bands, and dividing the total transmission and/or reception band into several frequency sub-bands during a translation from and/or to the baseband or intermediate frequencies of the RF signals transmitted and/or received.

The signals outputted by the fourth means may correspond to periodical signals the frequency spectra of which include lines of frequencies being integer multiples of $f_1$ and the main lines (having the greatest amplitude from all the spectral lines within the spectrum of each signal) of which are at the frequencies $f_{LO\_CHi} = (N+i-1) \cdot f_1$.

It is also provided a frequency synthesis device including at least:
  means able to generate a periodical signal with a frequency $f_1$,
  means able to generate, from the periodical signal with a frequency $f_1$, at least one pulsed periodical signal a centre frequency $f_G$ of which is equal to $N \cdot f_1$, with N an integer number higher than 1, the pulsed periodical signal periodically having a null value over part of the period of the periodical signal with a frequency $f_1$,
  means able to generate, from the pulsed periodical signal with a centre frequency $f_G$ equal to $N \cdot f_1$, periodical signals, for example sinusoidal ones, with a frequency $f_{LO\_CHi}$ corresponding to integer multiples of $f_1$.

The periodical signals $S_{LO\_CHi}$ to $S_{LO\_CHm}$ may be substantially sinusoidal signals each having a substantially constant envelope.

The second means may include at least one voltage-controlled oscillator a free oscillation range of which includes the centre frequency $f_G$, that is $N \cdot f_1$, the value of N may be a function of a value of a first control voltage for being applied at the input of the voltage-controlled oscillator. The free oscillation range may be defined as being the range of frequencies between the minimum frequency and the maximum frequency reachable by the voltage-controlled oscillator as a function of the first control voltage.

The third means may be able to generate a supply voltage of the second means as another periodical signal with a frequency $f_1$ the duty cycle of which may be lower than 1.

The third means may include at least one switch connected to a power supply input of the second means and able to be controlled by the periodical signal with a frequency $f_1$ for being generated by the first means.

The third means may include at least one switch connected to a power supply input of the oscillator and able to be controlled by the periodical signal with a frequency $f_1$ such that it generates a non-null supply voltage of the oscillator only during part of each period $T_1$.

The third means may include at least one switch connected to an output of the oscillator and able to be controlled by the periodical signal with a frequency $f_1$ such that it breaks an electrical connection between the output of the oscillator and the input of the fourth means during part of each period $T_1$.

The frequencies $f_{LO\_CHi}$ may be equal to frequencies $(N+i-1) \cdot f_1$.

The second means may include m voltage-controlled oscillators able to generate m signals $S_{G1}$ to $S_{Gm}$ each corresponding to a train of oscillations with a frequency substantially equal to $N_i \cdot f_1$, with a duration lower than a $T_1 = 1/f_1$ and periodically repeated at the frequency $f_1$, with $N_i$ integer numbers higher than 1, the free oscillation ranges of which include the frequencies $N_i \cdot f_1$, the values of $N_i$ being a function of values of first control voltages intended to be applied at the inputs of the voltage-controlled oscillators, and may further include one or more switches each connected to a power supply input of one of the oscillators and able to be controlled by the periodical signal with a frequency $f_1$ such that it generates a non-null supply voltage of one of the oscillators only during part of each period $T_1$ and/or one or more switches each connected to an output of one of the oscillators and able to be controlled by the periodical signal with a frequency $f_1$ such that it breaks an electrical connection between the output of one of the oscillators and the input of the fourth means during part of each period $T_1$, the switches may form the third means, and the fourth means may be able to generate the m periodical signals $S_{LO\_CH1}$ to $S_{LO\_CHm}$ from the signals $S_{G1}$ to $S_{Gm}$.

In this case, the frequencies $f_{LO\_CHi}$ may be equal to the frequencies $N_i \cdot f_1$ and/or the frequencies $N_i \cdot f_1$ may be consecutive integer multiples of the frequency $f_1$. Thus, the signals $S_{LO\_CH1}$ to $S_{LO\_CHm}$ may all have a same amplitude given that these signals are obtained by recovering main lines of the signal $S_{G1}$ to $S_{Gm}$.

The fourth means may include several frequency recovering circuits each outputting one of the m periodical signal signals $S_{LO\_CH1}$ to $S_{LO\_CHm}$, each frequency recovering circuit may include at least one injection-locked oscillator for receiving at the input the signal $S_G$ or one of the signals $S_{G1}$ to $S_{Gm}$ (periodically interrupted at the frequency $f_1$) and for being locked at least periodically at the frequency $f_{LO\_CHi}$ the value of which is a function of a value of a second control voltage intended to be applied at the input of the injection-locked oscillator and/or each frequency recovering circuit including at least one bandpass filter with a centre frequency substantially equal to $f_{LO\_CHi}$.

In this case, each frequency recovering circuit may include at least two injection-locked oscillators at least one of which is able to output one of the m periodical signals $S_{LO\_CH1}$ to $S_{LO\_CHm}$ and the other is able to output another periodical signal in a phase quadrature with said one of the m periodical signals $S_{LO\_CH1}$ to $S_{LO\_CHm}$ via a coupling made between both injection-locked oscillators or via a phase-shifter element arranged between the second means and the injection-locked oscillators.

The value of the frequency $f_1$ may be higher than about 500 MHz, and/or the values of the frequencies $f_{LO\_CHi}$ may be higher than about 10 GHz, and/or the oscillations of the signal $S_G$ or the signals $S_{G1}$ to $S_{Gm}$ may be sinusoidal.

The first means may include at least one resonator device and a phase-locked loop able to regulate the phase of the periodical signal with a frequency $f_1$ outputted by a voltage-controlled oscillator of the phase-locked loop to a phase of a periodical signal, for example a sinusoidal signal, outputted by the resonator device. thus, the frequency synthesis device can involve a phase-locked loop operating at a low frequency, which enables instability risks generated by a PLL operating at a high frequency as in prior art to be eliminated.

Alternatively, the first means may also include a resonator device able to generate the periodical signal, which is stable, with a frequency $f_1$.

The invention also relates to a device for transmitting and/or receiving signals, including at least one frequency synthesis device as previously described whose outputs on which are outputted the periodical signals $S_{LO\_CH1}$ to $S_{LO\_CHm}$ are connected to inputs of mixers of the transmitting and/or receiving device able to perform a frequency translation of the signals intended to be transmitted and/or received.

It is also provided a frequency synthesis method, including at least the steps of:
  generating a periodical signal with a frequency $f_1$,
  generating, from the periodical signal with a frequency $f_1$, at least one pulsed periodical signal a centre frequency $S_G$ of which is equal to $N \cdot f_1$, with N an integer number higher than 1, the pulsed periodical signal periodically having a non-null value only over part of each period of the periodical signal with a frequency $f_1$,
  generating, from the pulsed periodical signal with a centre frequency $S_G$, several periodical signals with a frequency $f_{LO\_CHi}$ corresponding to integer multiples of $f_1$.

The present invention further relates to a frequency synthesis method including at least the steps of:
  generating a periodical signal with a frequency $f_1$,
  generating, from the periodical signal with a frequency $f_1$, at least one signal $S_G$ corresponding to a train of oscillations with a frequency substantially equal to $N \cdot f_1$, with a duration lower than $T_1 = 1/f_1$ and periodically repeated at the frequency $f_1$, with N an integer number higher than 1,
  generating, from the signal $S_G$, m periodical signals $S_{LO\_CH1}$ to $S_{LO\_CHm}$ the frequency spectra of which each include a main line with a frequency $f_{LO\_CHi}$ corresponding to an integer multiple of $f_1$, with $1 \leq i \leq m$, i and m being integer numbers, via implementing a band-pass filtering function applied to the signal $S_G$ and discarding from the frequency spectra of each of the periodical signals $S_{LO\_CH1}$ to $S_{LO\_CHm}$ lines other than the main line with a frequency $f_{LO\_CHi}$.

The pulsed periodical signal generated by the second means having a non-null value only over part of each period of the periodical signal with a frequency $f_1$ means that this pulsed significant periodically has a non-null value over part of the period of the periodical signal with a frequency $f_1$.

The invention finally relates to a method for making a frequency synthesis device, including at least the steps of:
  making first means able to generate a periodical signal with a frequency $f_1$,
  making second and third means, coupled to the first means and able to receive at the input the periodical signal with a frequency $f_1$ and to generate at least one signal $S_G$ corresponding to a train of oscillations with a frequency substantially equal to $N \cdot f_1$, with a duration lower than $T_1 = 1/f_1$ and periodically repeated at the frequency $f_1$, with N an integer number higher than 1,
  making fourth means able to generate, from the signal $S_G$, m periodical signals $S_{LO\_CH1}$ to $S_{LO\_CHm}$ the frequency spectra of which each include a main line with a frequency $f_{LO\_CHi}$ corresponding to an integer multiple of $f_1$, with $1 \leq i \leq m$, i and m being integer numbers, by playing the role of a band-pass filter applied to the signal $S_G$ and discarding from the frequency spectra of each of the periodical signals $S_{LO\_CH1}$ to $S_{LO\_CHm}$ lines other than the main line with a frequency $f_{LO\_CHi}$.

BRIEF DESCRIPTION OF THE DRAWINGS

The present invention will be better understood upon reading the description of the exemplary embodiments given by way of purely indicating and no way limiting purposes referring to the appended drawings in which:

FIGS. 12A and 12B show waveforms and spectra of the signals generated in a frequency synthesis device, object of the present invention, FIG. 13 schematically shows a frequency synthesis device, object of the present invention, according to a second embodiment.

Identical, similar or equivalents parts of the different figures described hereinafter bear the same reference numerals such as to facilitate switching from one figure to another.

Different parts shown in the figures are not necessarily drawn to a uniform scale, to make the figures more understandable.

The different possibilities (alternatives and embodiments) should be understood as being not exclusive of each other and can be combined to each other.

DETAILED DISCLOSURE OF PARTICULAR EMBODIMENTS

Figure 4:
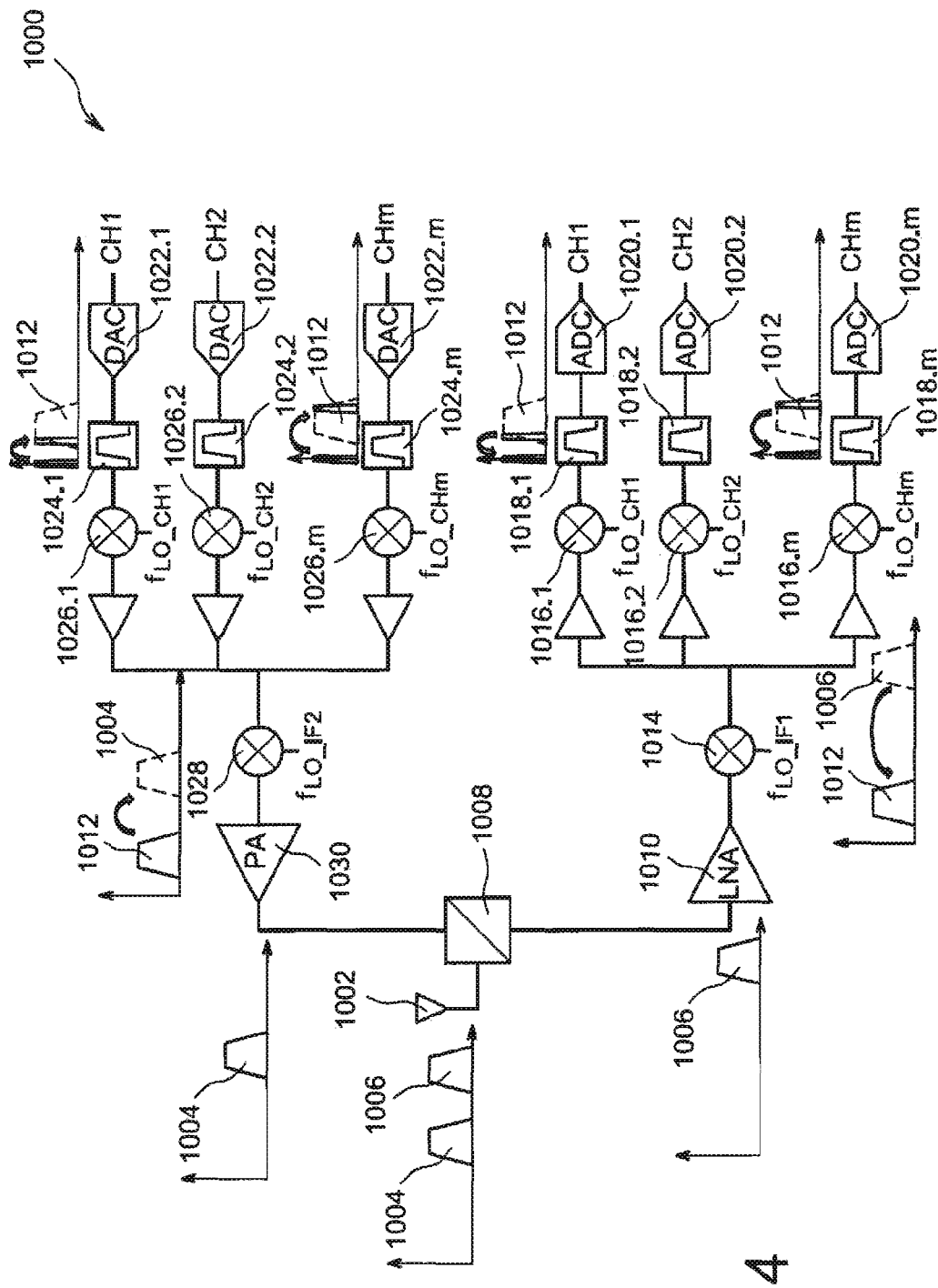

FIG. 4 is first referred to, which schematically shows part of a transceiver device 1000 able to perform transmission and reception of signals in a wide RF band, for example of the E-band-type (transmission in the bands 71-76 GHZ and 81-86 GHz), and performing frequency translations using m channels enabling the wide RF band to be distributed into m frequency sub-bands, m being an integer number higher than 1.

The device 1000 includes an antenna 1002 for transmitting and receiving data. In the example described herein, the frequency band used for transmitting data, symbolically shown with the reference 1004, is different from the frequency band used for receiving data, symbolically shown with the reference 1006. The device 1000 also includes an element 1008 enabling the antenna 1002 to operate together with the transmitting elements and receiving elements of the device 1000.

When a signal is received by the antenna 10002, it is sent, via the element 1008, at the input of a low noise amplifier (LNA) 1010, and then translated in an intermediate frequency band 1012 by a mixer 1014 receiving at the input the received signal and a stable signal with a frequency $f_{LO\_IF1}$.

Because of the large RF band width used, which also corresponds to the intermediate frequency band width 1012, it is not possible to use a single analog-digital converter to convert signals located in this frequency band. This wide frequency band is thus frequency demultiplexed in order to obtain m less wide frequency sub-bands distributed on m channels each comprising an analog-digital converter.

This demultiplexing is performed on the m channels via a second frequency translation of m parts of the intermediate frequency band 1012 to m lower intermediate frequency bands, or directly into baseband (directly into baseband in the example shown in FIG. 4). The sum of the m parts of the intermediate frequency band 1012 forms the entire intermediate frequency band 1012. In FIG. 4, this demultiplexing, or second frequency translation, is made via m mixers 1016.1-1016.m each receiving at the input the signal in the intermediate frequency band 1012 and a stable signal with a centre frequency suitable for the part of the intermediate frequency band 1012 intended to be recovered and translated into baseband in the channel. Each of the mixers 1016.1-1016.m thus receives at the input, in addition to the signal with intermediate frequencies, a stable signal with a different frequency for each channel, herein with frequencies $f_{LO\_CH1}$ to $f_{LO\_CHm}$, these signals being called $S_{LO\_CH1}$ to $S_{LO\_CHm}$. The baseband signals obtained at the output of the mixers 1016.1-1016.m are then individually filtered by band-pass filters 1018.1-1018.m, and then digitally converted by analog-digital converters 1020.1-1020.m, and outputted on the channels CH1 to CHm.

For making a signal transmission, operations reverse to those made during the previously described reception are implemented. Thus, the baseband signals of the channels CH1 to CHm are first individually converted by digital-analog converters 1022.1-1022.m, and then individually filtered by band-pass filters 1024.1-1024.m, and translated in the intermediate frequency band 1012 via a multiplexing in the frequency domain made by mixers 1026.1-1026.m each receiving at the input one of the filtered analog signals and one of the signals $S_{LO\_CH1}$ to $S_{LO\_CHm}$. Since the combined signals located in the intermediate frequency band 1012 form a single signal distributed on the entire intermediate frequency band 1012. A translation in the frequency band 1004 is then made by a mixer 1028 receiving at the input the signal in the intermediate frequency band 1012 as well as the signal with a frequency $f_{LO\_IF2}$. The output signal of the mixer 1028 is finally amplified by a power amplifier 1030 and then transmitted by the antenna 1002.

The different channels CH1 to CHm simultaneously operate upon transmitting or receiving data.

Figure 1:
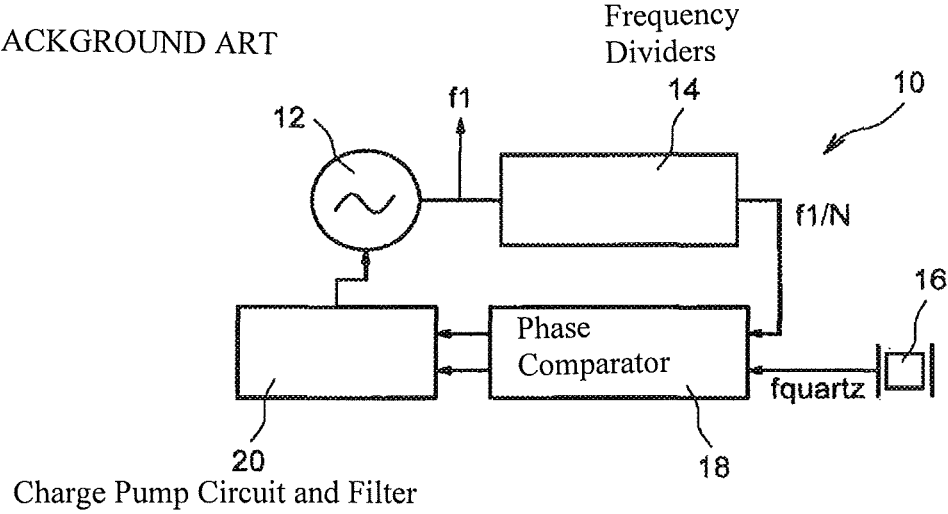
FIGS. 1 to 3 schematically show frequency synthesis devices according to prior art, FIG. 4 schematically shows a part of a device for transmitting-receiving RF signals, object of the present invention, according to a particular embodiment.
Figure 2:
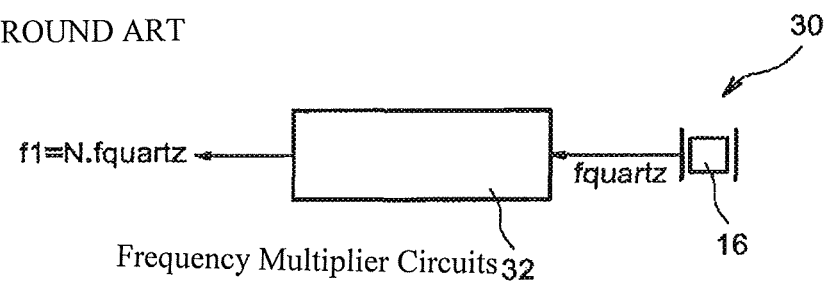
Figure 3:
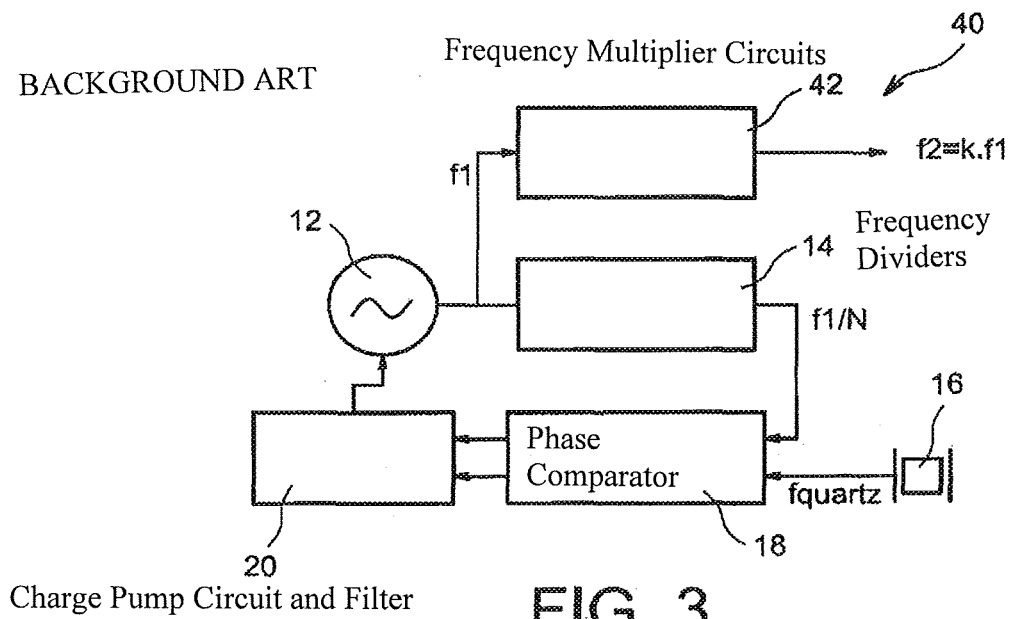
Figure 5:
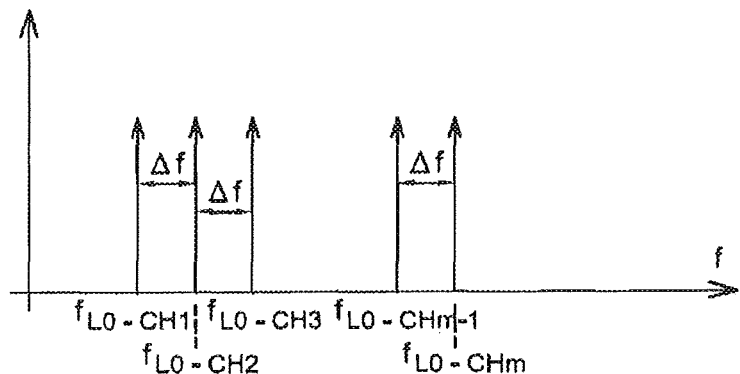
FIG. 5 shows the main lines of the signals $S_{LO\_CH1}$-$S_{LO\_CHm}$ used by the device for transmitting-receiving RF signals, object of the present invention, according to a particular embodiment, FIG. 6 schematically shows a frequency synthesis device, object of the present invention, according to a first embodiment, FIGS. 7A and 7B respectively show the waveform and the spectrum of a signal $S_C$ generated in a frequency synthesis device, object of the present invention, FIGS. 8A and 8B respectively show the waveform and the spectrum of a signal $S_G$ generated in a frequency synthesis device, object of the present invention, FIGS. 9A and 9B respectively show the waveform and the spectrum of a signal $S_{LO\_CHi}$ obtained at the output of a frequency synthesis device, object of the present invention.

Because the frequency sub-bands associated with the signals of each channel, both for transmission and reception, herein correspond to parts of an identical width and arranged close to each other in the frequency band 1004 or the frequency band 1006, and thus in the intermediate frequency band 1012, the frequencies $f_{LO\_CH1}$ to $f_{LO\_CHm}$ used for performing the frequency translation from or to the intermediate frequency band 1012 have the main characteristics of being evenly spaced out from each other by a value $\Delta f$. FIG. 5 shows the main lines of the signals $S_{LO\_CH1}$ to $S_{LO\_CHm}$. Thus, these frequencies are such that $f_{LO\_CH2}=f_{LO\_CH1}+\Delta f$, $f_{LO\_CH3}=f_{LO\_CH2}+\Delta f$, ..., and $f_{LO\_CHm}=f_{LO\_CHm-1}+\Delta f$, that is $f_{LO\_CHi}=f_{LO\_CH1}+(i-1)\cdot\Delta f$ with $1\leq i\leq m$. The frequencies $f_{LO\_CH1}$ to $f_{LO\_CHm}$ may each be a multiple of $\Delta f$, and advantageously consecutive integer multiples of $\Delta f$ as it is the case in the example of FIG. 4, with in this case, when $f_{LO\_CH1}=N\cdot\Delta f$, with N an integer number higher than 1, frequencies $f_{LO\_CH1}$ to $f_{LO\_CHm}$ that can be expressed therefore by the equation $f_{LO\_CHi}=(N+i-1)\cdot\Delta f$.

Depending on the desired frequency sub-bands, it is possible that these frequencies $f_{LO\_CH1}$ to $f_{LO\_CHm}$ are non-consecutive integer multiples of $\Delta f$ and/or that $f_{LO\_CH1}$ is not equal to $N\cdot\Delta f$.

Figure 6:
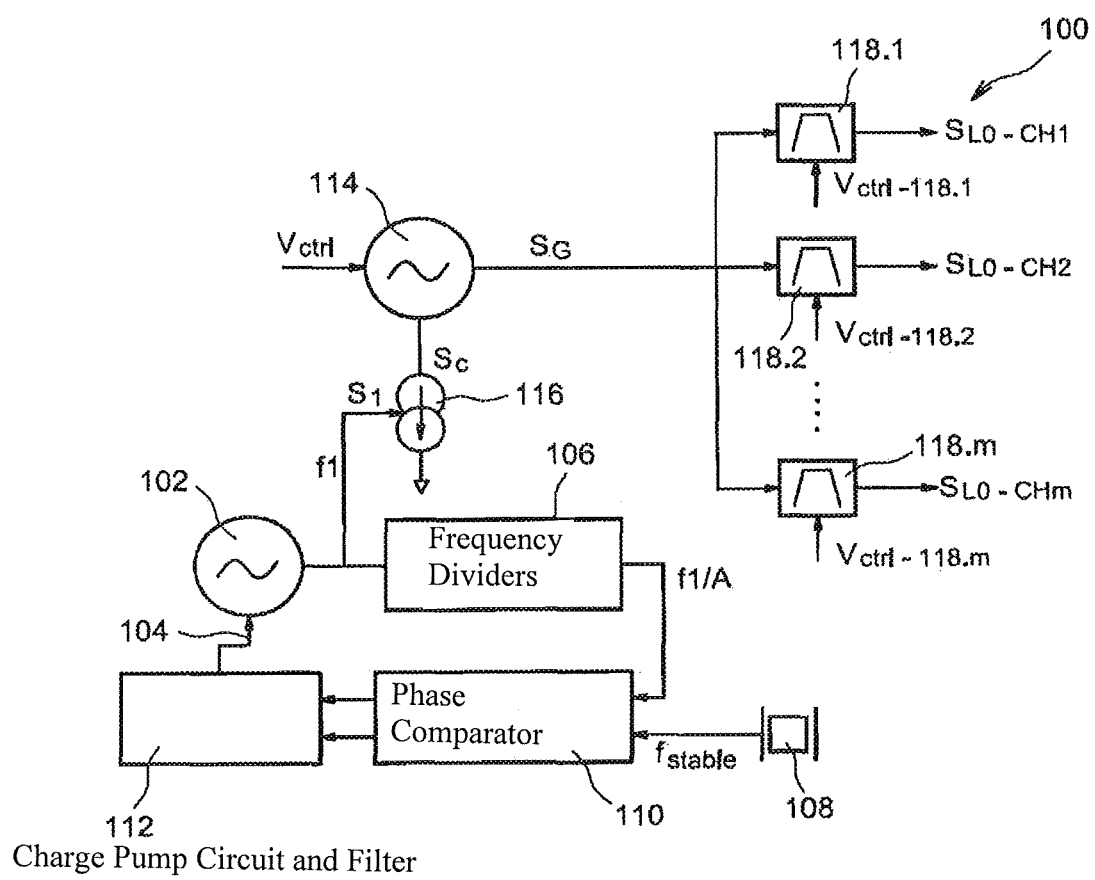

FIG. 6 is now referred to, which shows a frequency synthesis device 100 according to a first embodiment, enabling frequency stable signals $S_{LO\_CH1}$ to $S_{LO\_CHm}$ to be generated.

The device 100 includes an oscillator 102 for example of the VCO-type outputting a periodical signal $S_1$ with a frequency $f_1$, for example a sinusoidal one with an oscillation frequency $f_1$. The frequency $f_1$ can be assimilated to the value $\Delta f$ used in the example of the previously described transceiver device 1000. The frequency $f_1$ is controlled by a voltage applied to a control input 104 of the oscillator 102. In order to lock and stabilize the oscillation frequency $f_1$ of the signal $S_1$, the oscillator 102 is regulated by a phase-locked loop (PLL). This PLL includes one or more frequency dividers 106 able to divide the frequency of the signal $S_1$ by an integer or fractional number A. At the output of the frequency divider(s) 106, a periodical signal with a frequency $f_1/A$ is obtained, which is then compared with a very stable reference periodical signal with a frequency $f_{stable}$ provided by a resonator 108, for example a quartz resonator. The factor A is chosen such that the frequency $f_1/A$ is close to the frequency $f_{stable}$. A comparison between both these signals is made by a phase comparator 110 (PFD) generating an output signal proportional to the phase difference measured between both these signals, the value of which is positive or negative depending on the sign of the difference $f_1/A-f_{stable}$.

This output signal is sent at the input of a charge pump circuit and a filter 112 outputting the signal applied to the control input 104 of the oscillator 102 in order to adjust the oscillation frequency $f_1$, such that $f_1/A=f_{stable}$.

The elements 102, 106, 108, 110 and 112 enable the periodical signal $S_1$, for example a sinusoidal one, which is frequency stable to be obtained. Alternatively, it is possible to replace these elements 102, 106, 108, 110 and 112 by any device or structure able to provide such a frequency stable periodical signal $S_1$, corresponding for example to a single resonator device when such a resonator device can directly provide the signal $S_1$. The choice of the type of device or structure generating the periodical signal $S_1$ can in particular be made as a function of the desired frequency $f_1$. A single resonator device can be sufficient if the frequency $f_1$ does not exceed a value beyond which it can then be necessary to involve a PLL to generate the signal $S_1$.

The frequency synthesis device 100 further includes a generator of periodically repeated oscillations train (called "PROT" later) in the frequency band to be synthetized and several frequency recovering circuits.

In this first embodiment, the PROT generator comprises an oscillator 114 of the VCO-type voltage-controlled by a control signal $V_{ctrl}$, and controlled power supply means 116 electrically supplying the oscillator 114 and which are controlled by the signal $S_1$ with a frequency $f_1$ outputted by the oscillator 102. In the example of FIG. 6, this controlled power supply corresponds to a controlled current source 116 operating as a switch periodically interrupting (period $T_1=1/f_1$) the power supply of the oscillator 114. This controlled current source may correspond to an MOS transistor including a gate to which the signal $S_1$ is applied. Generally, these means 116 may include a switch connected to a power supply input of the oscillator 114 and able to be controlled by the periodical signal $S_1$.

The oscillator 114 is thus alternatively switched ON and OFF by this switch, that is switching off or not the supply of an output signal by the oscillator 114, successively at the frequency $f_1$. The oscillator 114 is controlled by a signal $S_C$ corresponding to the current generated by the current source 116 (and thus to the power voltage provided to the oscillator 114) and the waveform of which substantially corresponds to a positive square signal with a frequency $f_1$ (this square signal is not perfect and may have a trapezoidal shape, as it is the case for the signal $S_c$ shown in FIG. 7A). Thus, when the switching signal $S_C$ switches on the oscillator 114, a signal $S_G$ corresponding to a train of oscillations is created at the output of the VCO 114. A half-period $T_1/2$ (with $T_1=1/f_1$) later, the oscillator 114 is switched OFF and the oscillation is interrupted. The alternate ON and OFF states every half period $T_1/2$ corresponds to the case where the signal $S_C$ has a duty cycle equal to 0.5. The signal $S_C$ shown in FIG. 7A switches on the oscillator 114 for a duration $T_H$ which is equal, in this example, to $T_1/2$.

However, this duty cycle (equal to $T_H/T_1$) may be different from 0.5, and more generally between 0 and 1, the values 0 and 1 being excluded, the duration of the ON state may be greater or smaller than that of the OFF state.

Thus, a pulsed signal $S_G$ is created at a centre frequency $f_{OL}$, corresponding to the free oscillation frequency of the oscillator 114, with a repetition period equal to $T_1$. The signal $S_G$ thus corresponds to a PROT, that is here a train of oscillations with the frequency $f_{OL}$, with a duration lower than $T_1=1/f_1$ and periodically repeated with a repetition period equal to $T_1$. The signal $S_G$ has thus periodically a null value over part of each period $T_1$, this part of each period $T_1$ approximately corresponding to the part of each period $T_1$ during which the signal $S_C$ has a null value. A feature of the signal $S_G$ is that its phase is locked to that of the signal with a frequency $f_1$ provided by the oscillator 102 and it has a centre frequency $f_{OL}$ which is substantially equal to an integer multiple of $f_1$ ($f_{OL} \approx N \cdot f_1$). This property is due to the fact that at the start of the oscillation, the oscillator 114 has a high elasticity and is readily locked on a harmonic N of the frequency $f_1$ with N such that the product $N \cdot f_1$ is closest to the free oscillation frequency $f_{OL}$ of the oscillator 114 when it is in free oscillation. The value of N, and thus that of the frequency $f_{OL}$ depend on the value of the voltage $V_{ctrl}$ applied at the input of the oscillator 114.

Figure 7A:
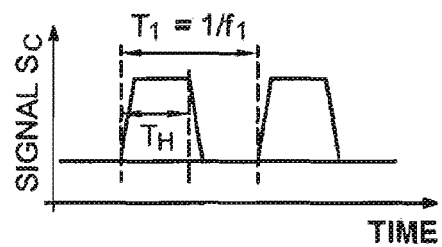
Figure 8A:
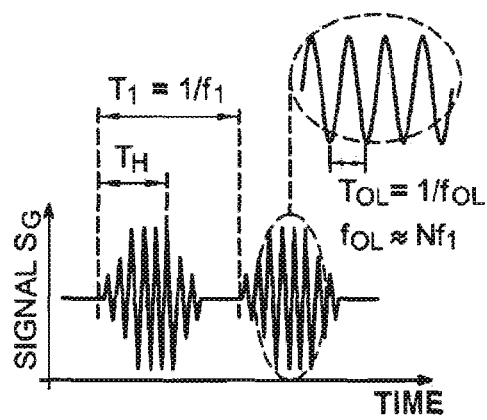
Figure 7B:
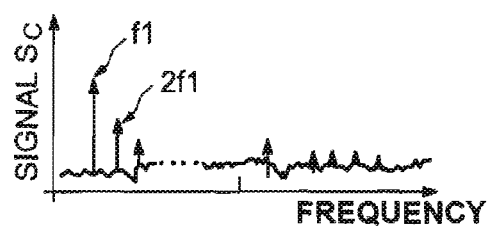
Figure 8B:
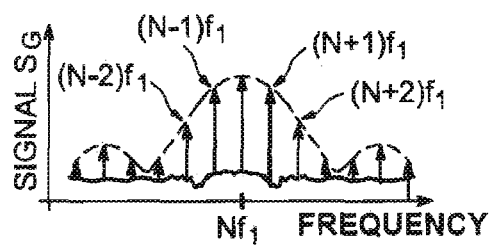

The equivalent spectrum of the signal $S_G$ has an envelope the shape of which corresponds to a cardinal sine, or sinc, the components of which are sinusoids with a centre frequency $N \cdot f_1$. The lines of the spectrum of $S_G$ are spaced out from each other by $f_1$. FIGS. 7A and 7B show the waveform (time domain) and the spectrum (frequency domain) of the signal $S_C$ respectively. Likewise, FIGS. 8a and 8B show the waveform and the spectrum of the signal $S_G$ respectively. In FIG. 8A, it can be seen that in each train of oscillations of the signal $S_G$, the amplitudes of the oscillations are increasing upon starting the oscillator 114 and are decreasing upon shutting off the oscillator 114. Furthermore, the oscillations of the train of oscillations of $S_G$ are similar, in terms of phase, amplitude and frequency, from one train to the other.

From the analytical point of view, the signal $S_G$ is obtained by convoluting in the time domain between a windowed sinus, with the frequency $f_{OL}$ (corresponding to the free oscillation frequency of the oscillator 114) and with a window width equal to $T_H$, with $T_H \in ]0, T_1[$, and a Dirac comb with a period equal to $T_1$. The signal $S_G$ can thus be expressed as:

$$S_G(t) = [\sin(2 \cdot \pi \cdot f_{OL} \cdot t) \cdot \Pi_{T_H}(t)] \otimes \sum_{k=-\infty}^{\infty} \delta(t - k \cdot T_1)$$

$\Pi_{T_H}(t)$ is the windowing function corresponding to:

$$\Pi_{T_H}(t) = \begin{cases} 0 & \forall t < 0 \\ 1 & \forall t \in ]0, T_1[ \\ 0 & \forall t > T_H \end{cases}$$

The frequency spectrum of the signal $S_G$ corresponds in this case to:

$$|S_G(f)|_{f>0} = \left[\frac{1}{2}\delta(f - f_{OL}) \otimes T_H \cdot \mathrm{sinc}(\pi \cdot f \cdot T_H)\right] \cdot f_1 \cdot \sum_{k=-\infty}^{\infty} \delta(f - k \cdot f_1)$$

For each of the lines of frequencies $f_j$ of the spectrum of the signal $S_G$ ($f_j$ being multiples of $f_1$), the amplitude $A_j$ of each of these lines can be expressed by the equation:

$$A_j = \frac{1}{2}\mathrm{sinc}(\pi(f_j - f_{OL}) \cdot T_H)$$

The signal $S_G$ is then used to obtain at the output of the device 100 the signals $S_{LO\_CH1}$ to $S_{LO\_CHm}$ corresponding to periodical signals, for example sinusoidal ones, the frequency spectra of which each include a main line, or peak, that is of the strongest value with respect to the other lines, with frequencies $f_{LO\_CH1}$ to $f_{LO\_CHm}$ corresponding to the frequencies to be synthetized by the device 100 and each corresponding to one of the frequencies $f_j$ of the spectrum of the signal $S_G$. Thus, in order to obtain these spectra each corresponding, or approximating a pure sinus without the lines adjacent to the centre frequency $f_{LO\_CHi}$, with $1 \leq i \leq m$, the device 100 includes several frequency recovering circuits 118.1 to 118.m, or line recovering circuits, the inputs of which are connected to the output of the pulsed oscillator 114. The frequency recovering circuits 118.1 to 118.m play the role of band-pass filters and each discard the lines adjacent to the frequency $f_{LO\_CHi}$ to be recovered. At the output of the frequency recovering circuits 118.1 to 118.m, the periodical signals $S_{LO\_CH1}$ to $S_{LO\_CHm}$ are obtained, the main lines of which each have a multiple of $f_1$ as a frequency, for example a sinusoidal signal with a substantially constant envelope the frequency $f_{LO\_CH1}$ of which is a multiple of $f_1$.

By considering the frequency $f_{LO\_CHi}$ corresponding to the main line of the signal $S_{LO\_CHi}$ as equal to $(N+i-1) \cdot f_1$, the phase noise of the signal $S_{LO\_CHi}$ is equal to the phase noise of the signal $S_1$ plus $20 \log(N+i-1)$:

$$Ph(N+i-1)_{dBc/Hz}^{f_{LO-CHi}} = Ph(N+i-1)_{dBc/Hz}^{f_1} + 20 \log(N+i-1)$$

Figure 9A:
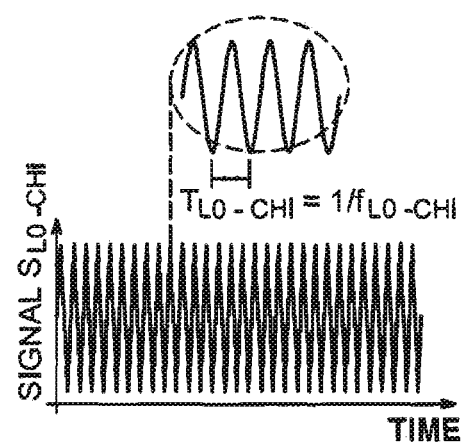
Figure 9B:
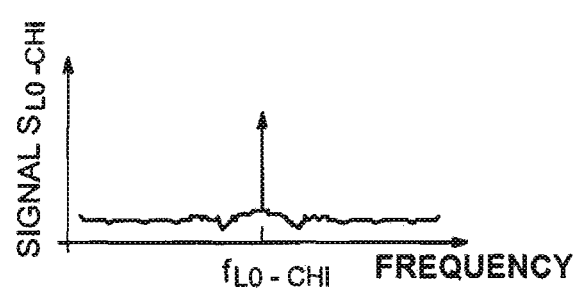

FIGS. 9A and 9B respectively show the waveform (time domain) and the spectrum (frequency domain) of one of the signals $S_{LO\_CH1}$ to $S_{LO\_CHm}$, called $S_{LO\_CHi}$. Thus, at the output of the device 100 a signal $S_{LO\_CH1}$ with a pure spectrum is obtained, that is including a single line at the frequency $f_{LO\_OHi}$ locked to $f_{stable}$, all the other undesired components have been discarded out of the frequency spectrum of the signal $S_{LO\_CHi}$ by the frequency recovering circuit 118.1.

The oscillators 102 and 114 are for example made as differential twisted pairs (resonators coupled with a negative resistance).

The oscillator 114 may for example be made as described in document "A 60 GHz UWB impulse radio transmitter with integrated antenna in CMOS 65 nm SOI technology" by A. Siligaris et al., Silicon Monolithic Integrated Circuits in RF Systems (SiRF), 2011 IEEE 11th Topical Meeting on, pp. 153-156, 17-19 Jan. 2011. The oscillator 102 can for example be made as described in document "A 17.5-to-20.94 GHz and 35-to-41.88 GHz PLL in 65 nm CMOS for wireless HD applications" by O. Richard et al., Solid-State Circuits Conference Digest of Technical Papers (ISSCC), 2010 IEEE International, pp. 252-253, 7-11 Feb. 2010.

The frequency recovering circuits 118.1 to 118.m each play a role of a band-pass filter with a very high selectivity, and may each correspond to an injection-locked, or synchronized, oscillator (ILO) circuit or several ILO circuits arranged in cascade. The manufacture of such an ILO is for example described in document "A 50 GHz direct injection-locked oscillator topology as low power frequency divider in 0.13 μm CMOS" by M. Tiebout, Solid-State Circuits Conference, 2003. ESSCIRC '03. Proceedings of the 29th European, pp. 73-76, 16-18 Sep. 2003.

Such an oscillator circuit operates continuously and in the absence of a signal $S_G$ applied at the input (when the signal $S_G$ periodically has a null value), each of the circuits 118.1 to 118.m outputs a free oscillation sinusoidal signal the frequency $f_{osc\_libre\_118.i}$ of which is in the same frequency band as $f_{LO\_CHi}$ ($f_{osc\_libre\_118.i} \approx f_{LO\_CHi}$). The value of the frequency $f_{osc\_libre\_118.i}$ depends on the value of a control signal $V_{ctrl\_118.i}$ applied on another input of the frequency recovering circuit 118.i.

When its first input is energized by the pulsed signal $S_G$ outputted by the oscillator 114, the frequency recovering circuits 118.$i$ is locked at the line of the signal $S_G$ closest to $f_{osc\_libre\_118.i}$. The control signal $V_{ctrl\_118.i}$ enables $f_{osc\_libre\_118.i}$ to be positioned close to $(N+i-1)\cdot f_1$ in order to accurately centre the signal $S_{LO\_CHi}$ on the frequency $(N+i-1)\cdot f_1$. It is thus possible to lock each of the frequency recovering circuits 118.1 to 118.$m$ on a line at $(N+i-1)\cdot f_1$ if the control signal $V_{ctrl\_118.i}$ is such that $f_{osc\_libre\_118.i}$ is located close to the line $(N+i-1)\cdot f_1$. The signals $S_{LO\_CH1}$ to $S_{LO\_CHm}$ obtained are thus actually phase-synchronized with each other.

The frequencies $f_{LO\_CHi}$, with $1 \leq i \leq m$, synthesizable by the device 100 are thus parameterable and for example equal to $(N+i-1)\cdot f_1$.

Programming, or adjusting, values of the synthetized frequencies $f_{LO\_CH1}$ is thus performed via the parameters N and/or I and/or $f_1$.

In this advantageous embodiment, the signal $V_{ctrl\_118.1}$ is chosen such that $f_{LO\_CH1}=N\cdot f_1$. Thus, the frequency of the line of the signal $f_{LO\_CH1}$ corresponds to the frequency of $f_G$, namely the frequency of the main line of the signal $S_G$. The signals $V_{ctrl\_118.2}$ to $V_{ctrl\_118.m}$ applied at the input of the other frequency recovering circuits 118.2 to 118.$m$ are further such that the frequencies $f_{LO\_CH2}$ to $f_{LO\_CHm}$ of the signals $S_{LO\_CH2}$ to $S_{LO\_CHm}$ correspond to the following integer multiples of $f_1$, that is such that $f_{LO\_CHi}=(N+i-1)\cdot f_1$.

Alternatively, it is possible that the signal $V_{ctrl\_118.1}$ is chosen such that the frequency of the line of the signal $f_{LO\_CH1}$ corresponds to a multiple of $f_1$ other than the frequency $f_G$, that is a frequency adjacent to the frequency of the main line of the signal $S_G$.

Moreover, it is also possible that the frequencies $f_{LO\_CH1}$ to $f_{LO\_CHm}$ are non-consecutive integer multiples of $f_1$.

The frequency $f_G$ can be modified via the value of the control signal $V_{ctrl}$ of the oscillator 114 on the one hand, and the frequencies $f_{LO\_CHi}$ can be modified by the values of the control signals $V_{ctrl\_118.i}$ applied at the input of the frequency recovering circuits 118.1 to 118.$m$ on the other hand.

A first possibility for programming the value of the frequency $f_{LO\_CHi}$ (or of another of the frequencies $f_{LO\_CHi}$) consists in locking the oscillator 114 directly to the desired frequency at the output such that $f_{OL} \approx f_{LO\_CH1}=N\cdot f_1$. Indeed, as previously explained, at the start of the oscillation, the oscillator 114 has a high elasticity and tends to be readily locked on a harmonic N of the frequency $f_1$. The value of the oscillation frequency $f_{OL}$ of the oscillator 114 is set by adjusting the value of V Cu such that $f_{OL}=f_{LO\_CH1}=N\cdot f_1$. The centre frequency $f_{OL}$ of the spectrum of the oscillator 114 is then locked to the line $N\cdot f_1$. The frequency recovering circuit 118.1 (or one of the other frequency recovering circuits 118.$i$ if the programmed frequency corresponds to the frequency $f_{LO\_CHi}$) has at its input a signal $S_G$ the spectrum of which is a cardinal sine, or sinc, of the lines spaced out by $f_1$ the centre line of which is located at $f_{OL}=f_G=N\cdot f_1$. The control signal $V_{ctrl\_118.1}$ of the frequency recovering circuit 118.1 is chosen such that the locking occurs on the centre line, at the frequency $f_{OL}$.

Thus, in this first possible programming of the value of the $f_{LO\_CH1}$, the value of the synthetized frequency $f_{LO\_CH1}$ is chosen via choosing the value of the control signal $V_{ctrl}$ of the oscillator 114 (determining the value of N), the value of the control signal $V_{ctrl\_118.1}$ of the frequency recovering circuit 118.1 being constant.

Another possibility for adjusting the value of $f_{LO\_CH1}$ (or another of the frequencies $f_{LO\_CHi}$) consists in locking the oscillator 114 on a frequency $f_{OL}=N\cdot f_1$ with N being fixed (that is $V_{ctrl}$ with a constant value). The spectrum of the output signal $S_G$ is a cardinal sine of lines spaced out by $f_1$ the centre line of which is the frequency $f_{OL}$. The control signal $V_{ctrl\_118.1}$ of the frequency recovering circuit 118.1 (or of one of the other frequency recovering circuits 118.$i$ if the programmed frequency corresponds to the frequency $f_{LO\_CHi}$) is then chosen such that the locking occurs on one of the lines adjacent to the centre line $f_{OL}$ corresponding to the intended frequency $f_{LO\_CH1}$ preferably in the main lobe of the cardinal sine spectrum. In this second programming example, the value of the synthesized frequency $f_{LO\_CH1}$ is chosen via choosing the value of the control signal $V_{ctrl\_118.1}$ of the frequency recovering circuit 118.1, the value of the control signal $V_{ctrl}$ of the oscillator 114 being constant and chosen such that the value of N is such that the line with a frequency $f_{LO\_CH1}$ is located in the main lobe of the cardinal sine spectrum with a centre line at the frequency $f_{OL}$ such that $f_{OL}=N\cdot f_1$).

In a third programming possibility of the value of $f_{LO\_CH1}$ (or of another of the frequencies $f_{LO\_CHi}$), it is possible to combine both previous possibilities. The aim is then to act on both the control signal $V_{ctrl}$ of the oscillator 114 (acting on the value of N) and the control signal $V_{ctrl\_118.1}$ of the frequency recovering circuit 118.1 to synthetize the desired frequency $f_{LO\_CH1}$.

Regardless of the programming possibility chosen from those previously set forth, the values of the frequencies $f_{LO\_CH1}$ to $f_{LO\_CHm}$ can also be modified via adjusting or choosing the value of the frequency $f_1$ given that the value of $f_1$ corresponds to the spacing of the lines in the spectrum of the signal $S_G$, and thus to the spacing between the frequencies $f_{LO\_CH1}$ to $f_{LO\_CHm}$.

Figure 10:
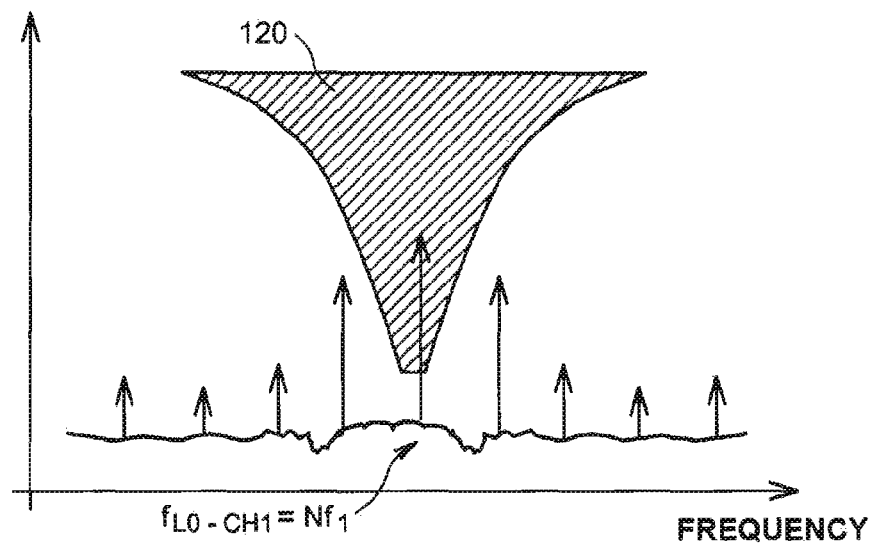
FIG. 10 shows the selectivity of a frequency recovering circuit being part of a frequency synthesis device, object of the present invention.

Each of the frequency recovering circuits 118.1 to 118.$m$ enables a line of the spectrum of the signal $S_G$ outputted by the oscillator 114 to be selected, these lines being preferably located in the main lobe of the spectrum of the signal $S_G$ (the frequencies $f_{LO\_CH1}$ to $f_{LO\_CHm}$ therefore corresponding preferably to frequencies of the lines of the main lobe of the spectrum of the signal $S_G$). Each of these circuits acts both as a very selective band-pass filter and as a signal regenerator, through the locking made on the frequency $(N+i-1)\cdot f_1$. The selectivity of the frequency recovering circuit 118.1, when it corresponds to an injection-locked oscillator (ILO) type circuit, is for example shown in FIG. 10. The zone referenced as 120 represents the locking range of such an ILO which, in the example of FIG. 10, is locked to the centre line of the spectrum of the signal $S_G$ which is closest to its free oscillation frequency.

Figure 11A:
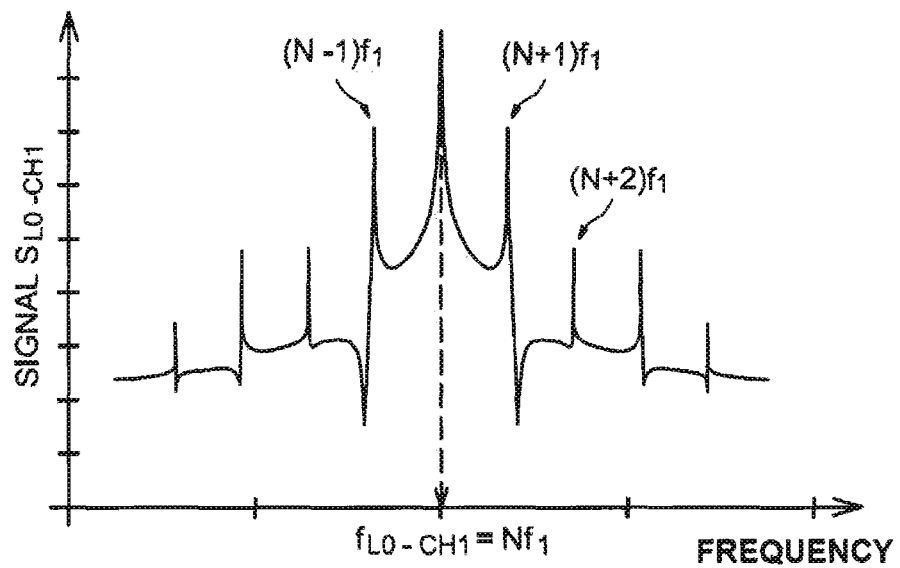
FIGS. 11A and 11B show signals $S_{LO\_CHi}$ obtained at the output of a frequency synthesis device.
Figure 11B:
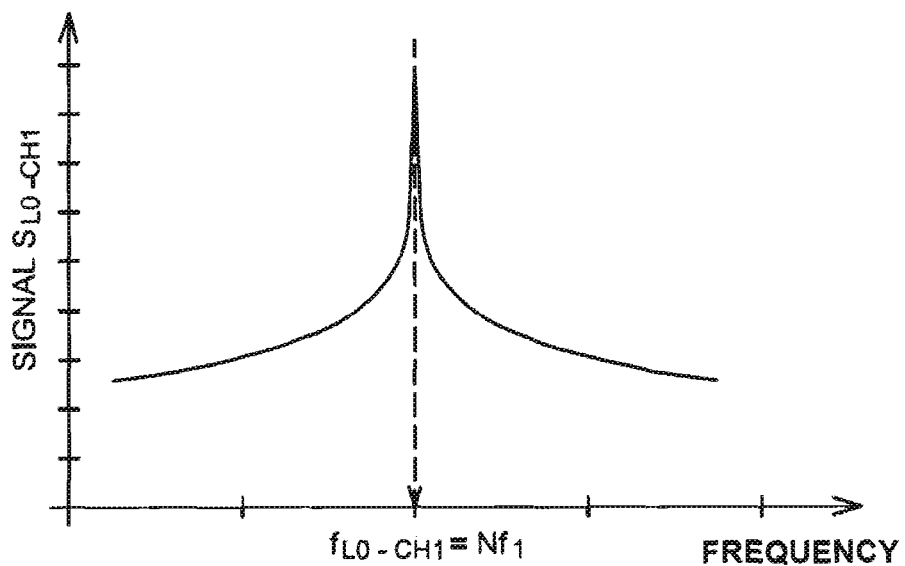

The output signal of this ILO is mainly comprised of this line but the rejection of the adjacent lines is not infinite. Thus, the signal $S_{LO\_CH1}$ obtained at the output of the frequency recovering circuit 118.$i$ may correspond not to a pure sinusoidal signal, but to a periodical signal the envelope of which is never null (unlike the signal $S_G$ the envelope of which is periodically null) and the frequency spectrum of which has a main line at the frequency $f_{LO\_CHi}$. The secondary lines of this spectrum, located at multiple frequencies of $f_1$, are attenuated with respect to the secondary lines of the spectrum of the signal $S_G$. FIG. 11A shows the spectrum of the signal $S_{LO\_CH1}$ obtained for example with the frequency recovering circuit 118.1 comprising a single ILO. It is possible to increase this rejection by connecting in cascade (that is in series) one or several other ILOs to form the frequency recovering circuit 118.$i$ and thus further attenuate the secondary lines of the spectrum of the signal $S_{LO\_CHi}$, which enables the constancy of the envelope of the signal $S_{LO\_CHi}$ to be improved. FIG. 11B shows the spectrum of the signal $S_{LO\_CH1}$ obtained for example with the frequency recovering circuit 118.1 comprising several ILOs connected in cascade. It can be seen in this figure that the signal $S_{LO\_CH1}$ thus nearly corresponds to a pure sinusoidal signal. This is also applicable to the other signals $S_{LO\_CHi}$.

As regards the shape of the spectrum of the signal $S_G$, the lower the duty cycle of this signal, the wider the first lobe of the cardinal sine. Thus, a small duty cycle implies the presence of a greater number of lines in the main lobe of the spectrum of the signal $S_G$. This principle is illustrated in FIGS. 12A and 12B which show the waveforms of the signals $S_C$ and $S_G$, and the spectrum of the signal $S_G$, for two signals $S_C$ with different duty cycles $\alpha_1$ $(=T_H/T_1)$ and $\alpha_2$ $(=T_{H2}/T_1)$, the duty cycle $\alpha_1$ of the signal $S_C$ shown in FIG. 12A being higher than the duty cycle $\alpha_2$ of the signal $S_C$ shown in FIG. 12B.

Alternatively, each of the frequency recovering circuits 118.1 to 118.$m$, or part of these circuits, may correspond to one or more band-pass filters connected in cascade. This or these filter(s) forming the frequency recovering circuit 118.$i$ is (are) made such that its (their) centre frequency is close to the line of the signal $S_G$ with a frequency $(N+i-1)\cdot f_1$, which enables the signal $S_G$ to be filtered and the line with a frequency $(N+i-1)\cdot f_1$ corresponding to the desired frequency $f_{LO\_CHi}$ to be recovered. This or these filter(s) is (are) also made such that it (they) is (are) very selective. This or these filter(s) may be made in different ways, for example as a bulk acoustic wave (BAW) filter, LC (from inductors and capacitances) or even surface acoustic waves (SAW) filter. Moreover, it is also possible that the frequency recovering circuit 118.$i$ includes one or more ILOs and one or more band-pass filters connected in cascade.

Figure 13:
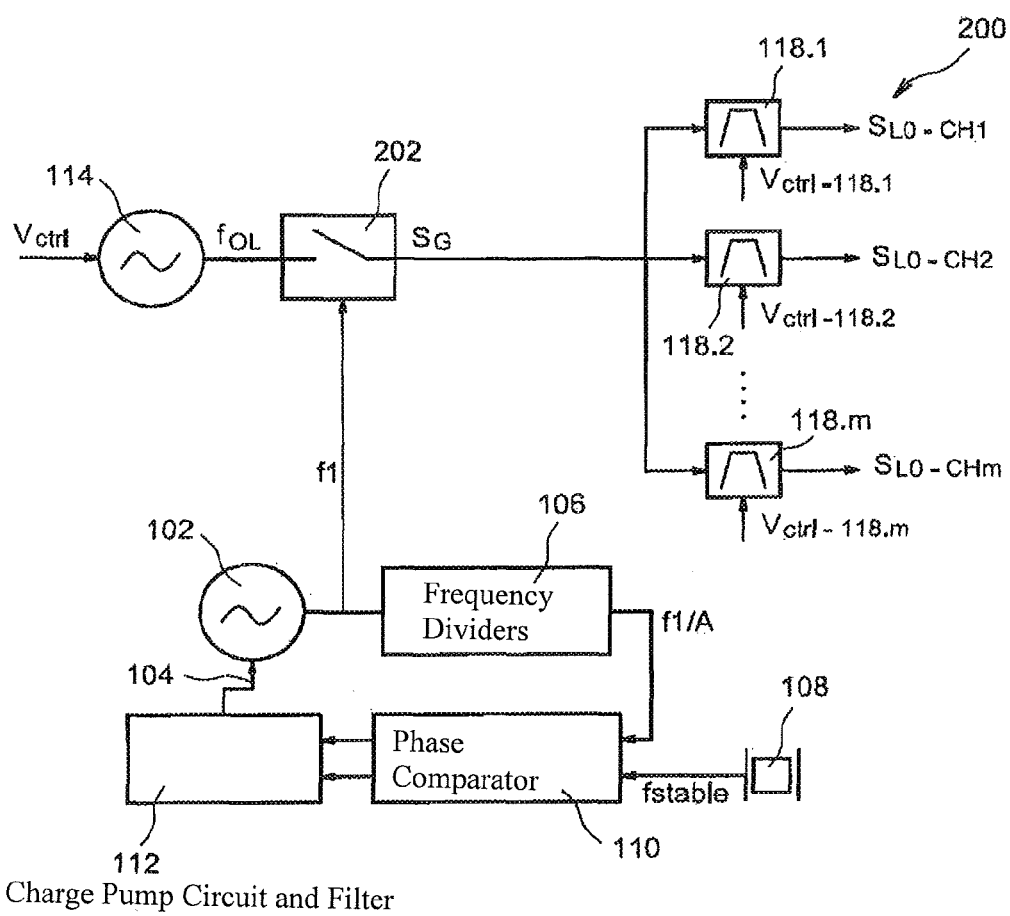

FIG. 13 is referred to, which shows a frequency synthesis device 200 according to a second embodiment.

With respect to the previously described device 100, the oscillator 114 is no longer controlled by a periodically interrupted power source, but is continuously supplied, providing a sinusoidal signal with a frequency $f_{OL}$. This signal is sent at the input of the switch 202 controlled by the periodical signal $S_1$. The switch 202 is periodically (period $T_1$) in a closed position for a duration equal to $T_H$ (for example equal to $T_1/2$ in the case of a duty cycle of 0.5) and in an open position for a duration equal to $T_1-T_H$.

In this case, at the input of the circuits 118.1 to 118.$m$, a PROT type signal $S_G$ is obtained, that is of the oscillations-train type with a frequency $f_{OL}$ periodically repeated with a repetition period equal to $T_1$. The oscillations of the oscillations trains of $S_G$ are generally not similar, in terms of phase, from one train to the other.

From the analytic point of view, this signal $S_G$ corresponds to the product of a sinus with a frequency $f_{OL}$ (the free oscillation frequency of the oscillator 114) and a periodical square signal with a period $T_1$ and a duration in the high state $T_H$ with $T_H \in ]0,T_1[$ such that:

$$S_G(t) = \sin(2\cdot\pi\cdot f_{OL}\cdot t)\cdot\left[\Pi_{T_H}(t)\otimes \sum_{k=-\infty}^{\infty}\delta(t-k\cdot T_1)\right]$$

The frequency spectrum of the signal $S_G$ corresponds in this case to:

$$|S_G(f)|_{f>0} = \frac{1}{2}\delta(f-f_{OL})\otimes\left[T_H\cdot\mathrm{sinc}(\pi\cdot f\cdot T_H)\cdot f_1\cdot \sum_{k=-\infty}^{\infty}\delta(f-k\cdot f_1)\right]$$

For each of the lines with frequencies $f_j$ of the spectrum of the signal $S_G$ $(f_j=f_{OL}+j\cdot f_1$, and j being a positive, negative or null integer number), the amplitude $A_j$ of each of these lines can be expressed by the equation:

$$A_j = \frac{T_H}{2\cdot T_1}\mathrm{sinc}\left(\pi\cdot j\frac{T_H}{T_1}\right)$$

The different alternative embodiments of the frequency recovering circuits 118.1 to 118.$m$ previously described for the frequency synthesis device 100 can also be applicable to the frequency synthesis device 200.

An exemplary embodiment of the frequency synthesis device 100 is described below.

Figure 14:
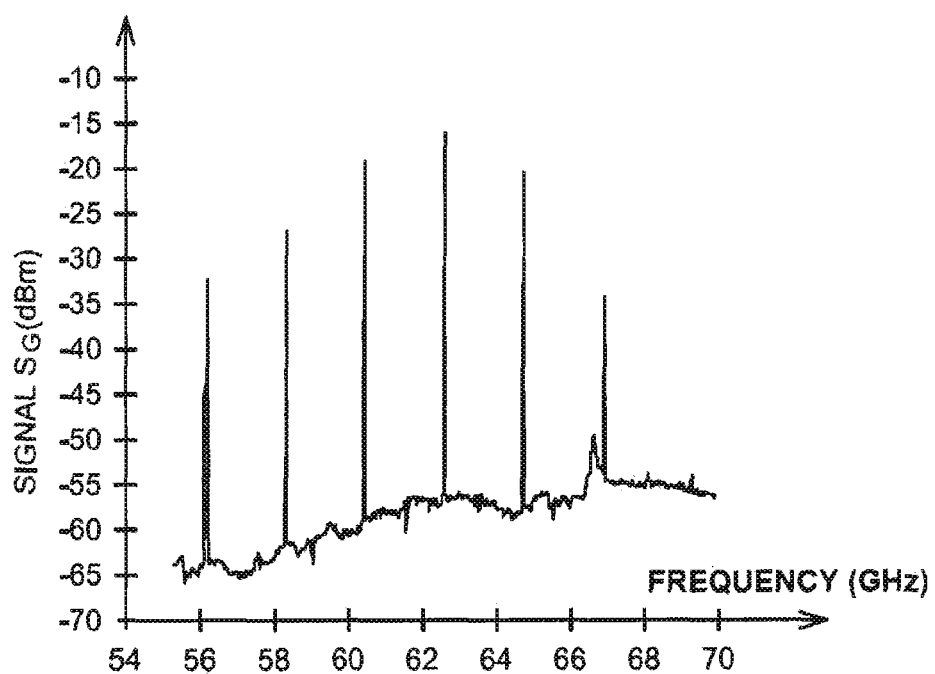
FIG. 14 shows the spectrum of a signal $S_G$ generated in a frequency synthesis device, object of the present invention.
Figure 15:
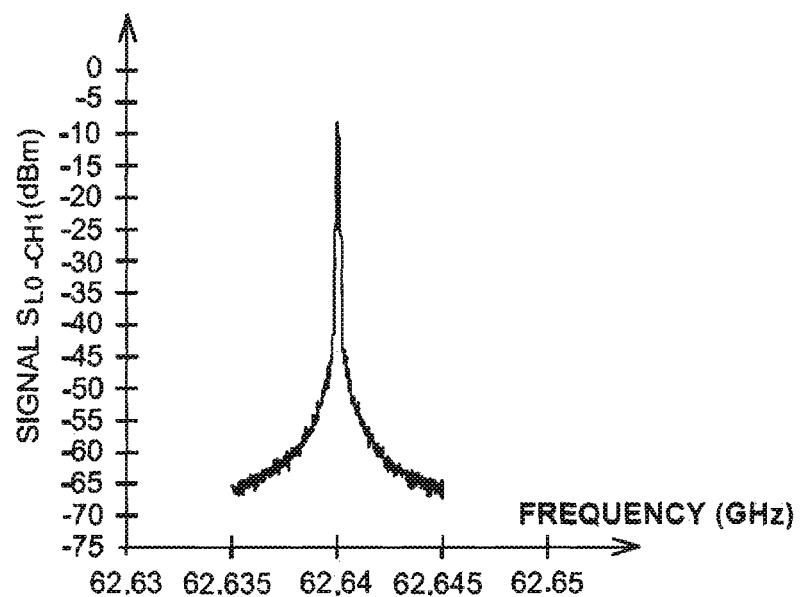
FIG. 15 shows the spectrum of a signal $S_{LO\_CH1}$ obtained at the output of a frequency synthesis device of the present invention.
Figure 16:
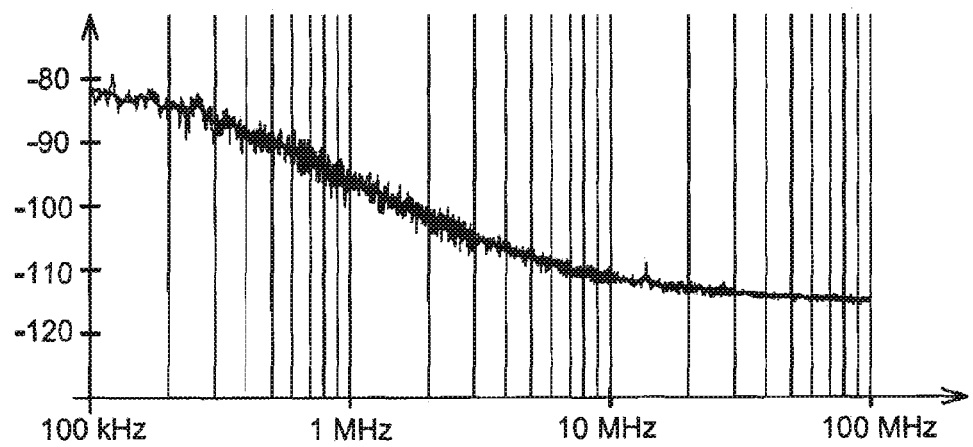
FIG. 16 shows the phase noise of the signal $S_{LO\_CH1}$ obtained at the output of a frequency synthesis device, object of the present invention, FIG. 17 schematically shows a frequency synthesis device, object of the present invention, according to a third embodiment.

The PLL providing the signal $S_1$, the current source 116 and the oscillator 114 as well as the frequency recovering circuits 118.1 to 118.$m$ are made for example in 65 nm CMOS technology for example on SOI in order to obtain for example a frequency synthesis device in accordance with IEEE.802.15.3c standard relating to WPAN, Wireless HD or WiGig networks, wherein the signal transmissions are for example performed in a frequency range between about 57 GHz and 66 GHz. The elements 102, 106, 108, 110 and 112 are made in order to obtain at the output of the oscillator 102 a signal $S_1$ with a frequency $f_1$ equal to about 2.16 GHz with a reference signal $f_{stable}$=36 MHz. The oscillator 114 is for example made in order to output a signal $S_G$ the spectrum of which is shown in FIG. 14. It can be seen in this spectrum that the different lines, representing the different possible communication channels according to the communication standards, are actually spaced out by $f_1$ from each other. The control voltages $V_{ctrl}$ and $V_{ctrl\_118.1}$ to $V_{ctrl\_118.m}$ are chosen such that the frequency recovering circuits 118.1 to 118.$m$ output signals $S_{LO\_CH1}$ to $S_{LO\_CHm}$ with a frequency corresponding to the different lines of the spectrum of $S_G$. The control voltage $V_{ctrl\_118.1}$ is for example chosen such that the frequency recovering circuit 118.1 outputs a signal $S_{LO\_CH1}$ with a frequency $f_{LO\_CH1}$=62.64 GHz. The spectrum of the signal $S_{LO\_CH1}$ obtained at the output of such a frequency synthesis device 100 is shown in FIG. 15. Finally, the phase noise of this signal $S_{LO\_CH1}$ is shown in FIG. 16. This also applies for making the frequency synthesis device 200.

The frequency synthesis device 100 or 200 can also be used in an RF transmission system 1000 such as the one previously described in connection with FIG. 4, for providing to the mixers 1026.1 to 1026.$m$ and to the mixers 1016.1 to 1016.$m$ the signals $S_{LO\_CH1}$ to $S_{LO\_CHm}$ with a frequency $f_{LO\_CH1}$ a$f_{LO\_CHm}$.

In the embodiments and alternative embodiments of the frequency synthesis device 100 and 200 previously described, the obtained signals $S_{LO\_CH1}$ to $S_{LO\_CHm}$ at the output are all phase-synchronized with each other because these signals are obtained from a same signal $S_G$. Yet, because the spectrum of the signal $S_G$ has an envelope the shape of which corresponds to a cardinal sine centred on the frequency $f_G$, the amplitudes of the obtained signals $S_{LO\_CH1}$ to $S_{LO\_CHm}$ correspond to the amplitudes of the lines of the recovered frequencies which vary, the amplitudes of the signals $S_{LO\_CH1}$ to $S_{LO\_CHm}$ being thus different from each other.

Figure 17:
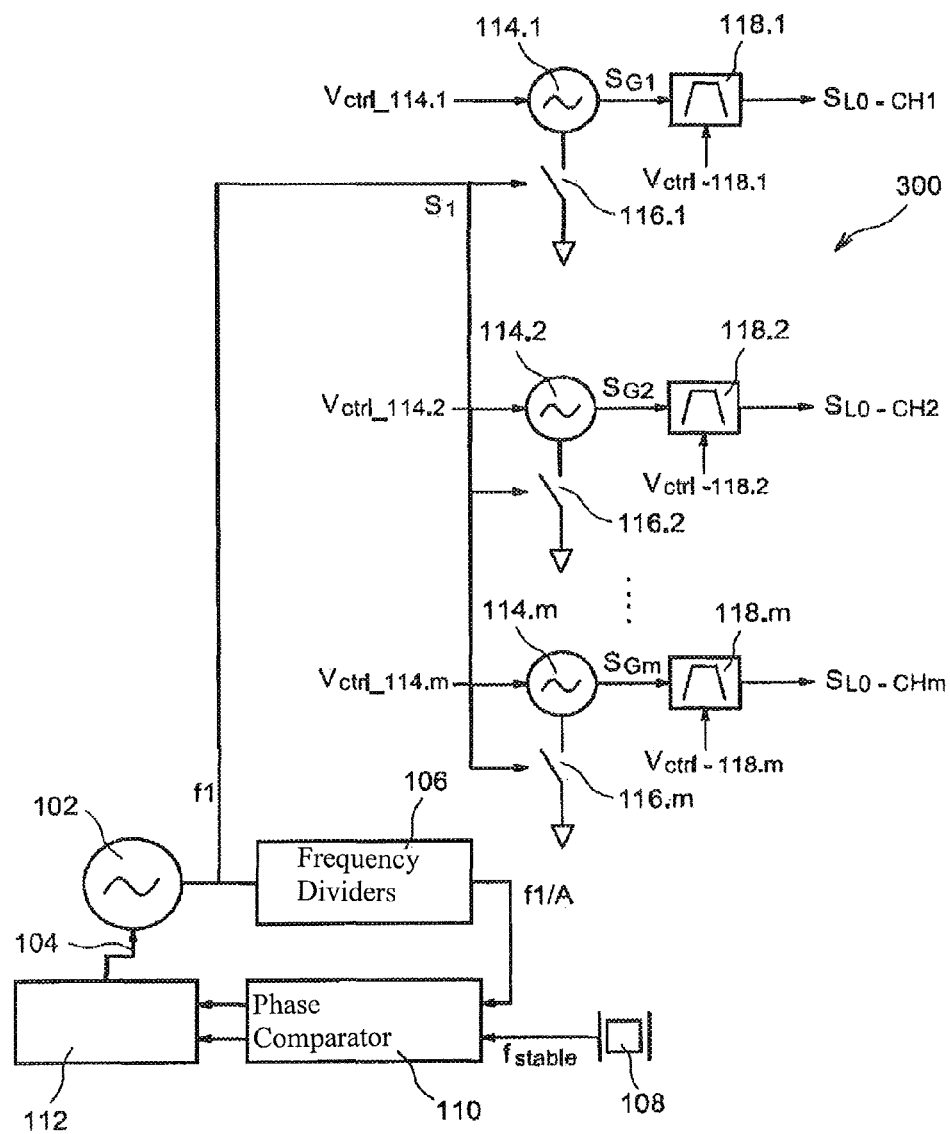
Figure 18:
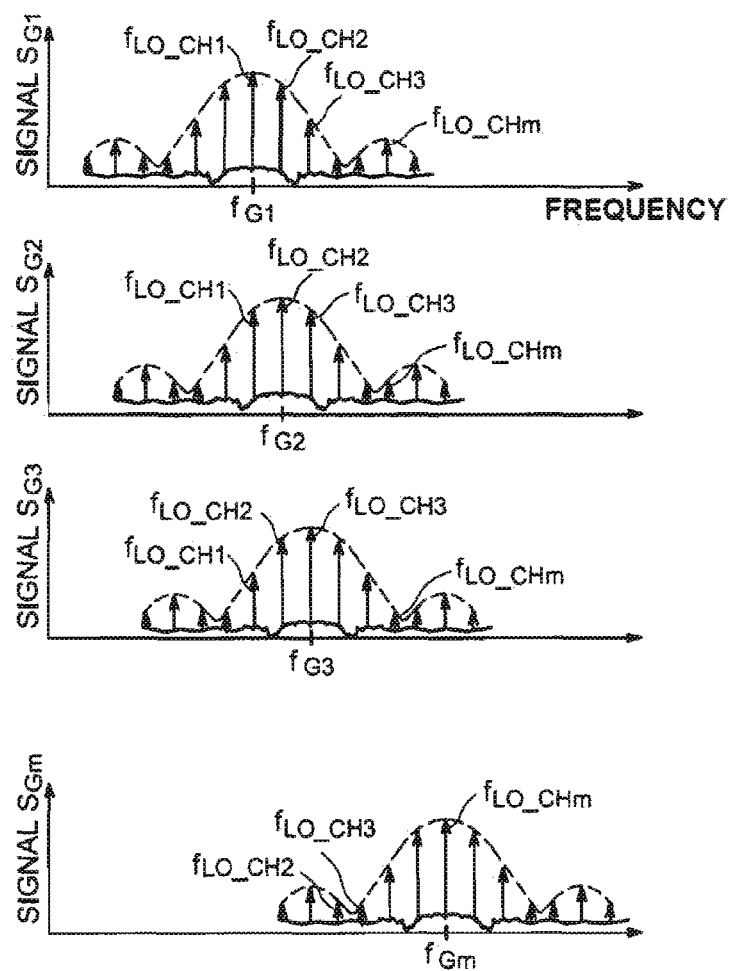
FIG. 18 shows the spectra of signals $S_{G1}$-$S_{Gm}$ generated in a frequency synthesis device, object of the present invention, according to the third embodiment.

FIG. 17 shows a frequency synthesis device 300 according to a third embodiment. As the previously described device 100, the device 300 includes the elements 102, 106, 108, 110 and 112 for generating the periodical signal $S_1$. Yet, the device 300 includes several PROT generators each including a VCO-type oscillator 114.1 to 114.m, each being voltage-controlled by a specific control signal $V_{ctrl\_114.1}$ to $V_{ctrl\_114.m}$, and controlled power supply means 116.1 to 116.m each associated with one of the oscillators 114.1 to 114.m and for example of a nature similar to the previously described means 116. Thus, m pulsed signals $S_{G1}$ to $S_{Gm}$ are generated, the control voltages $V_{ctrl\_114.1}$ to $V_{ctrl\_114.m}$ being such that the centre frequencies of the pulsed signals $S_{G1}$ to $S_{Gm}$ are different from each other and correspond to the frequencies $f_{LO\_CH1}$ à $f_{LO\_CHm}$ for being recovered via the frequency recovering circuits 118.1 to 118.m. FIG. 18 shows examples of spectra of the signals $S_{G1}$ to $S_{Gm}$ obtained.

This third embodiment thus enables stable signals $S_{LO\_CH1}$ to $S_{LO\_CHm}$ the frequencies $f_{LO\_CH1}$ to $f_{LO\_CHm}$ of which are multiples of $f_1$, which are phase-synchronized (because the control means 116.1 to 116.m are controlled by the same signal $S_1$) and which are of a same amplitude because the frequencies $f_{LO\_CH1}$ to $f_{LO\_CHm}$ correspond to the centre frequencies of the pulsed signals $S_{G1}$ to $S_{Gm}$ to be obtained. As previously, the frequencies $f_{LO\_CH1}$ to $f_{LO\_CHm}$ can be consecutive or not integer multiples of $f_1$, this being chosen via choosing control voltages $V_{ctrl\_114.1}$ to $V_{ctrl\_114.m}$ and $V_{ctrl\_118.1}$ to $V_{ctrl\_118.m}$ (in the example of FIG. 18, the frequencies $f_{LO\_CHi}$ to $f_{LO\_CHm}$ are consecutive integer multiples of $f_1$).

The different alternative embodiments described for the devices 100 and 200 can apply for this device 300 (each frequency recovering circuit 118.1-118.m can include one or more ILOs and/or one or more band-pass filters, controllers for the oscillators 114.1-114.m by control means 116.1-116.m or use of switches 202 controlled by the signal $S_1$, etc.).

In another alternative embodiment of the frequency synthesis devices 100, 200 and 300, it is possible that these devices provide, at the output of each of the frequency recovering circuits 118.1-118.m, two signals $S_{LO\_CHi\_I}$ and $S_{LO\_CHi\_Q}$ with the same frequency and same amplitude, but which have a 90° phase shift between them, that is one in phase with the signal $S_1$ and the other in phase quadrature with respect to $S_1$ (I/Q signals). Such an alternative can in particular be used within a multichannel architecture making a direct conversion from an intermediate frequency band to the baseband.

Figure 19:
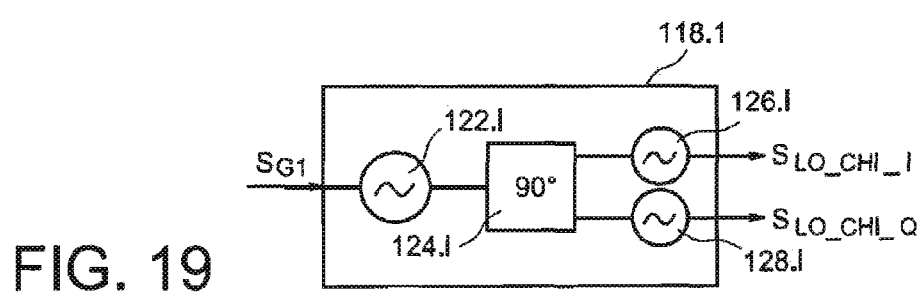
FIG. 19 shows an exemplary embodiment of a frequency recovering circuit of a frequency synthesis device, object of the present invention.

FIG. 19 shows an exemplary embodiment of a frequency recovering circuit 118.i enabling such signals to be outputted. The circuit 118.i receives at the input the PROT-type pulsed signal Sm. The circuit 118.i includes a first ILO 122.i the input of which receives the signal Sw and the output of which is connected to the input of an active or passive-type phase shift element 124.i enabling the signal applied at the in input to be reproduced on one of its two outputs and, the 90° phase-shifted signal applied at the input to be generated on the other one of its two outputs. Each of both signals are applied at the inputs of two other ILOs 126.i and 128.i outputting the signals $S_{LO\_CHi\_I}$ and $S_{LO\_CHi\_Q}$. Both ILOs 126.i and 128.i operate either independently of each other, or in a coupled manner such that the outputs of both ILOs 126.i and 128.i are 90° phase-shifted from each other without involving the phase-shift element 124.1. The operation of such a quadrature VCO (QVCO)-type element is for example described in document "A 17.5-to-20.94 GHz and 35-to-41.88 GHz PLL in 65 nm CMOS for wireless HD applications" by O. Richard et al., Solid-States Circuits Conference Digest of Technical Papers (ISSCC), 2010 IEEE International, pages 252-253, 7-11 Feb. 2010.

Figure 20:
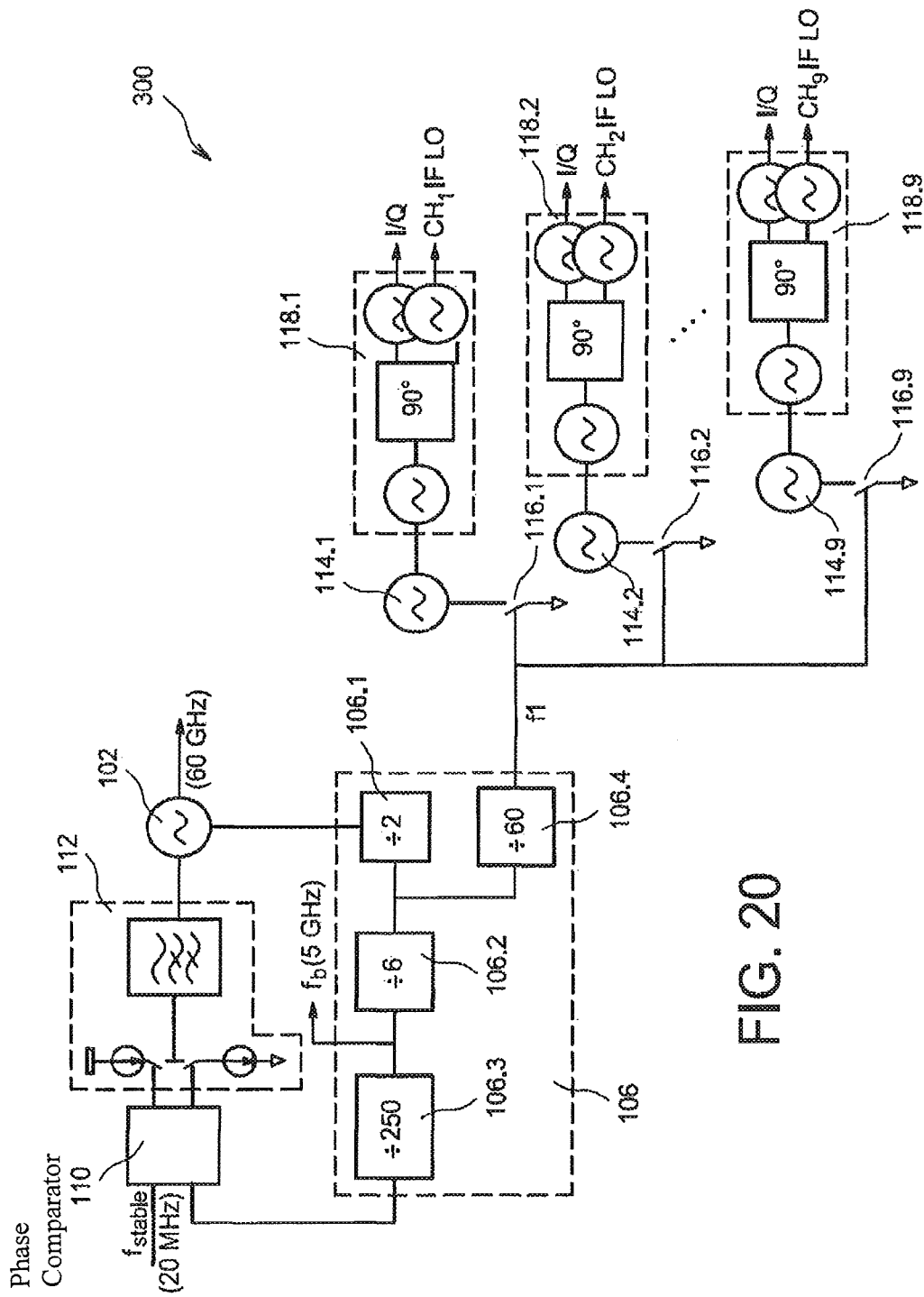
FIG. 20 shows an exemplary embodiment of a frequency synthesis device, object of the present invention, according to the third embodiment.

In connection with FIG. 20, an exemplary embodiment of the frequency synthesis device 300 including frequency recovering circuits corresponding to the circuit 118.i previously described in connection with FIG. 19 is described.

This frequency synthesis device is intended to be used in an RF transmission system operating in the E-band frequency range and using nine channels, each with a band width equal to 500 MHz and with centre frequencies ranging from 16.5 GHz to 20.5 GHz. The reference signal used includes a frequency $f_{stable}$ equal to 20 MHz sent at the input of the phase comparator 110. The output signals of the phase comparator 110 are sent at the input of the charge pump circuit and the filter 112 (herein a high-pass filter) outputting the signal applied to the control input of the oscillator 102 which is a VCO outputting a signal with a frequency equal to 60 GHz (this signal being further used in the first high and low conversion stages of the RF transmission system, that is used as a base for generating the signals with the frequencies $f_{LO\_IF1}$ and $f_{LO\_IF2}$ for the system 1000 previously described in connection with FIG. 4). This signal is sent at the input of the frequency dividers 106 formed by a first frequency divider 106.1 making a frequency division by 2 and connected in series to a second frequency divider 106.2 making a frequency division by 6 itself connected in series with a third frequency divider 106.3 making a frequency division by 250. The signal obtained at the output of the first frequency divider 106.1 is also sent at the input to a fourth frequency divider 106.4 making a frequency division by 60 and outputting the signal $S_1$ with a frequency $f_1$ equal to 500 MHz used for controlling the means 116.1 to 116.9 controlling supply to the oscillators 114.1 to 114.9. The signals $S_{LO\_CH1}$ to $S_{LO\_CH9}$ (with an in-phase signal and a quadrature signal for each of the nine channels) are obtained at the output of the frequency recovering circuits 118.1-118.9, the frequencies $f_{LO\_CH1}$ to $f_{LO\_CH9}$ of these signals ranging from 16.5 GHz to 20.5 GHz and being spaced out by 500 MHz from each other.

The previously described frequency synthesis devices can also be used in an electro-optical type transceiver device able to send data via a wavelength multiplexing (WDM), that is by modulating several wavelengths sent via a same optical wave guide. Another way to exploit a great optical band width consists in applying a wide band modulation to a single optical wavelength.

The OFDM corresponds to this modulation type in which several electric subcarriers having frequencies evenly spaced out from each other are individually modulated by different baseband signals and then combined and translated about the optical frequency. A frequency synthesis device as previously described can thus be used within an OFDM-type electro-optical transceiver device to provide the subcarriers with different frequencies. Each of these frequencies is in this case modulated with a different data stream and then frequency translated in the optical domain by using a modulator or laser in order to provide an OFDM signal.

The invention claimed is:

1. A frequency synthesis device comprising:
   a first generator configured to generate a periodical signal with a frequency $f_1$;
   a second generator coupled to the first generator and configured to receive at an input the periodical signal with the frequency $f_1$ and to generate at least one signal $S_G$ corresponding to a train of oscillations with a frequency substantially equal to $N \cdot f_1$, with a duration lower than $T_1 = 1/f_1$ and periodically repeated at the frequency $f_1$, with N an integer number higher than 1;
   a third generator configured to generate, from the signal $S_G$, m periodical signals $S_{LO\_CH1}$ to $S_{LO\_CHm}$ with frequency spectra that each include a main line with a frequency $f_{LO\_CHi}$ corresponding to an integer multiple of $f_1$, with $1 \leq i \leq m$, i and m being integer numbers, the third generator operating as a band-pass filter applied to the signal $S_G$ and discarding from the frequency spectra of each of the periodical signals $S_{LO\_CH1}$ to $S_{LO\_CHm}$ lines other than the main line.

2. The frequency synthesis device according to claim 1, wherein the periodical signals $S_{LO\_CH1}$ to $S_{LO\_CHm}$ are substantially sinusoidal signals each having a substantially constant envelope.

3. The frequency synthesis device according to claim 1, wherein the second generator includes:
at least one voltage-controlled oscillator with a free oscillation range that includes the frequency $N \cdot f_1$, the value of N being a function of a value of a first control voltage for being applied at an input of the voltage-controlled oscillator, and
at least one switch connected to a power supply input of the oscillator and configured to be controlled by the periodical signal with the frequency $f_1$ such that it generates a non-null supply voltage to the oscillator only during part of each period $T_1$, or at least one switch connected to an output of the oscillator and configured to be controlled by the periodical signal with the frequency $f_1$ such that it breaks an electrical connection between the output of the oscillator and an input of the third generator during part of each period $T_1$.

4. The frequency synthesis device according to claim 1, wherein the frequencies $f_{LO\_CHi}$ are equal to frequencies $(N+i-1) \cdot f_1$.

5. The frequency synthesis device according to claim 1, wherein the second generator includes:
m voltage-controlled oscillators configured to generate m signals $S_{G1}$ to $S_{Gm}$ each corresponding to a train of oscillations with a frequency substantially equal to $N \cdot f_1$, with a duration lower than $T_1 = 1/f_1$ and periodically repeated at the frequency $f_1$, with $N_1$ integer numbers higher than 1, free oscillation ranges of which include the frequencies $N_i \cdot f_1$, values of $N_i$ being a function of values of first control voltages for being applied at inputs of the voltage-controlled oscillators, and
one or more switches each connected to a power supply input of one of the oscillators and configured to be controlled by the periodical signal with the frequency $f_1$ such that it generates a non-null supply voltage of one of the oscillators only during part of each period $T_1$ and/or one or more switches each connected to an output of one of the oscillators and configured to be controlled by the periodical signal with the frequency $f_1$ such that it breaks an electrical connection between the output of one of the oscillators and an input of the third generator during part of each period $T_1$, the switches being included in the second generator, and the third generator being configured to generate the m periodical signals $S_{LO\_CH1}$ to $S_{LO\_CHm}$ from the signals $S_{G1}$ to $S_{Gm}$.

6. The frequency synthesis device according to claim 5, wherein the frequencies $f_{LO\_CHi}$ are equal to the frequencies $N_i \cdot f_1$ and/or wherein the frequencies $N_i \cdot f_1$ are consecutive integer multiples of the frequency $f_1$.

7. The frequency synthesis device according to claim 1, wherein the third generator includes plural frequency recovering circuits each outputting one of the m periodical signals $S_{LO\_CH1}$ to $S_{LO\_CHm}$, each frequency recovering circuit including at least one injection-locked oscillator for receiving at an input the signal $S_G$ or one of signals $S_{G1}$ to $S_{Gm}$ and being at least periodically locked at the frequency $f_{LO\_CHi}$, a value of which is a function of a value of a second control voltage for being applied at an input of the injection-locked oscillator and/or each frequency recovering circuit including at least one band-pass filter with a center frequency substantially equal to $f_{LO\_CHi}$.

8. The frequency synthesis device according to claim 7, wherein each frequency recovering circuit includes at least first and second injection-locked oscillators, the first of which is configured to output one of the m periodical signals $S_{LO\_CH1}$ to $S_{LO\_CHm}$ and the second of which is configured to output another periodical signal in phase quadrature with the first of the m periodical signals $S_{LO\_CH1}$ to $S_{LO\_CHm}$ via a coupling made between both injection-locked oscillators or via a phase shifter element arranged between the second generator and the injection-locked oscillators.

9. The frequency synthesis device according to claim 1, wherein a value of the frequency $f_1$ is higher than about 500 MHz, and/or values of the frequencies $f_{LO\_CHi}$ are higher than about 10 GHz, and/or oscillations of the signal $S_G$ or of signals $S_{G1}$ to $S_{Gm}$ are sinusoidal.

10. The frequency synthesis device according to claim 1, wherein the first generator includes at least one resonator device and a phase-locked loop configured to regulate a phase of the periodical signal with the frequency $f_1$ outputted by the voltage-controlled oscillator of the phase-locked loop to a phase of a periodical signal outputted by the resonator device.

11. The frequency synthesis device according to claim 1, wherein the first generator includes a resonator device configured to generate the periodical signal with the frequency $f_1$.

12. A device for transmitting and/or receiving signals, comprising at least one frequency synthesis device according to claim 1, whose outputs on which are outputted the periodical signals $S_{LO\_CH1}$ to $S_{LO\_CHm}$ are connected to inputs of mixers of the transmitting and/or receiving device configured to carry out a frequency translation of the signals to be transmitted and/or received.

13. A frequency synthesis method, comprising:
generating a periodical signal with a frequency $f_1$;
generating, from the periodical signal with the frequency $f_1$, at least one signal $S_G$ corresponding to a train of oscillations with a frequency substantially equal to $N \cdot f_1$, with a duration lower than $T_1 = 1/f_1$ and periodically repeated at the frequency $f_1$, with N an integer number higher than 1;
generating, from the signal $S_G$, m periodical signals $S_{LO\_CH1}$ to $S_{LO\_CHm}$ with frequency spectra that each include a main line with a frequency $f_{LO\_CHi}$ corresponding to an integer multiple of $f_1$, with $1 \leq i \leq m$, i and m being integer numbers, via implementing a band-pass filtering function applied to the signal $S_G$ and discarding from the frequency spectra of each of the periodical signals $S_{LO\_CH1}$ to $S_{LO\_CHm}$ lines other than the main line.

14. A method for making a frequency synthesis device, comprising:
making a first generator configured to generate a periodical signal with a frequency $f_1$;
making a second generator, coupled to the first generator and configured to receive at an input the periodical signal with the frequency $f_1$ and to generate at least one signal $S_G$ corresponding to a train of oscillations with a frequency substantially equal to $N \cdot f_1$, with a duration lower than $T_1=1/f_1$ and periodically repeated at the frequency $f_1$, with N an integer number higher than 1;

making a third generator configured to generate, from the signal $S_G$, m periodical signals $S_{LO\_CH1}$ to $S_{LO\_CHm}$ with frequency spectra that each include a main line with a frequency $f_{LO\_CHi}$ corresponding to an integer multiple of $f_1$, with $1 \leq i \leq m$, i and m being integer numbers, by operating as a band-pass filter applied to the signal $S_G$ and discarding from the frequency spectra of each of the periodical signals $S_{LO\_CH1}$ to $S_{LO\_CHm}$ lines other than the main line.

\* \* \* \* \*